US006898132B2

(12) United States Patent
Parkin

(10) Patent No.: US 6,898,132 B2
(45) Date of Patent: May 24, 2005

(54) SYSTEM AND METHOD FOR WRITING TO A MAGNETIC SHIFT REGISTER

(75) Inventor: Stuart S. P. Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 10/458,147

(22) Filed: Jun. 10, 2003

(65) Prior Publication Data

US 2004/0252538 A1 Dec. 16, 2004

(51) Int. Cl.$^7$ ............................................... G11C 7/00
(52) U.S. Cl. ..................... 365/189.12; 365/80; 365/86; 365/88
(58) Field of Search ............................. 365/189.12, 80, 365/86, 88

(56) References Cited

U.S. PATENT DOCUMENTS

| | | | | |
|---|---|---|---|---|
| 3,333,255 A | * | 7/1967 | Loev | 365/83 |
| 3,611,328 A | | 10/1971 | Spain | 340/174 TF |
| 3,846,770 A | | 11/1974 | Schwee et al. | 340/174 |
| 3,868,659 A | | 2/1975 | Schwee | 340/174 |
| 3,997,885 A | | 12/1976 | Battarel | 340/174 |
| 4,075,612 A | | 2/1978 | Johnson et al. | 365/171 |
| 4,075,613 A | | 2/1978 | Torok | 365/87 |
| 4,080,591 A | | 3/1978 | Torok | 365/171 |
| 4,192,012 A | | 3/1980 | Schwee et al. | 365/87 |
| 4,199,819 A | | 4/1980 | Schwee et al. | 365/87 |
| 4,250,565 A | | 2/1981 | Cosimini et al. | 365/87 |
| 4,253,160 A | | 2/1981 | Paul et al. | 365/87 |
| 4,253,161 A | | 2/1981 | Paul et al. | 365/87 |
| 4,410,963 A | | 10/1983 | Lo et al. | 365/87 |
| 5,650,958 A | | 7/1997 | Gallagher et al. | 365/173 |
| 5,729,410 A | | 3/1998 | Fontana, Jr. et al. | 360/113 |
| 5,801,984 A | | 9/1998 | Parkin | 365/158 |
| 6,834,005 B1 | * | 12/2004 | Parkin | 365/80 |
| 2002/0101761 A1 | | 8/2002 | Naji | 365/171 |
| 2003/0107833 A1 | | 6/2003 | Rettner et al. | 360/48 |
| 2003/0128460 A1 | | 7/2003 | Zolla | 360/97.01 |

OTHER PUBLICATIONS

Y.Ooba et al., "A Thin Magnetic Film Shift Register," Paper 6.4, presented at the 1972 INTERMAG Conference, Kyoto, Japan, Apr. 10–13, 1972.
Hermann Deichelmann, "Magnetic Domain Tip Memories—Construction and Applications," Journal of Magnetism and Magnetic Materials 4 (1977) 174–179.
D.H. Smith, "A Magnetic Shift Register Employing Controlled Domain Wall Motion," IEEE Transaction on Magnetics, vol. Mag–1, No. 4, Dec. 1965, pp. 281–284.
J. S. Sallo et al., "An "ORTHOCORE" Magnetic Shift Register," IEEE Transactions on Magnetics, vol. MAG–2, No. 3, Sep. 1966, pp. 197–201.
L. Geppert, "The New Incredible Memories," IEEE Spectrum, Apr. 2003, pp. 49–54.
Richard Butner, "Computing Unplugged, Magnetic RAM cures your computer of short–ter memory loss," available at: http://www.research.ibm.com/thinkresearch/pages/2001/20010202_mram.shtml, as of May 14, 2003.

* cited by examiner

Primary Examiner—Van Thu Nguyen
Assistant Examiner—Pho M. Luu
(74) Attorney, Agent, or Firm—Samuel A. Kassatly

(57) ABSTRACT

A writing device can change the direction of the magnetic moment in a magnetic shift register, thus writing information to the domains or bits in the magnetic shift register. Associated with each domain wall are large magnetic fringing fields. The domain wall concentrates the change in magnetism from one direction to another in a very small space. Depending on the nature of the domain wall, very large dipolar fringing fields can emanate from the domain wall. This characteristic of magnetic domains is used to write to the magnetic shift register. When the domain wall is moved close to another magnetic material, the large fields of the domain wall change the direction of the magnetic moment in the magnetic material, effectively "writing" to the magnetic material.

35 Claims, 23 Drawing Sheets

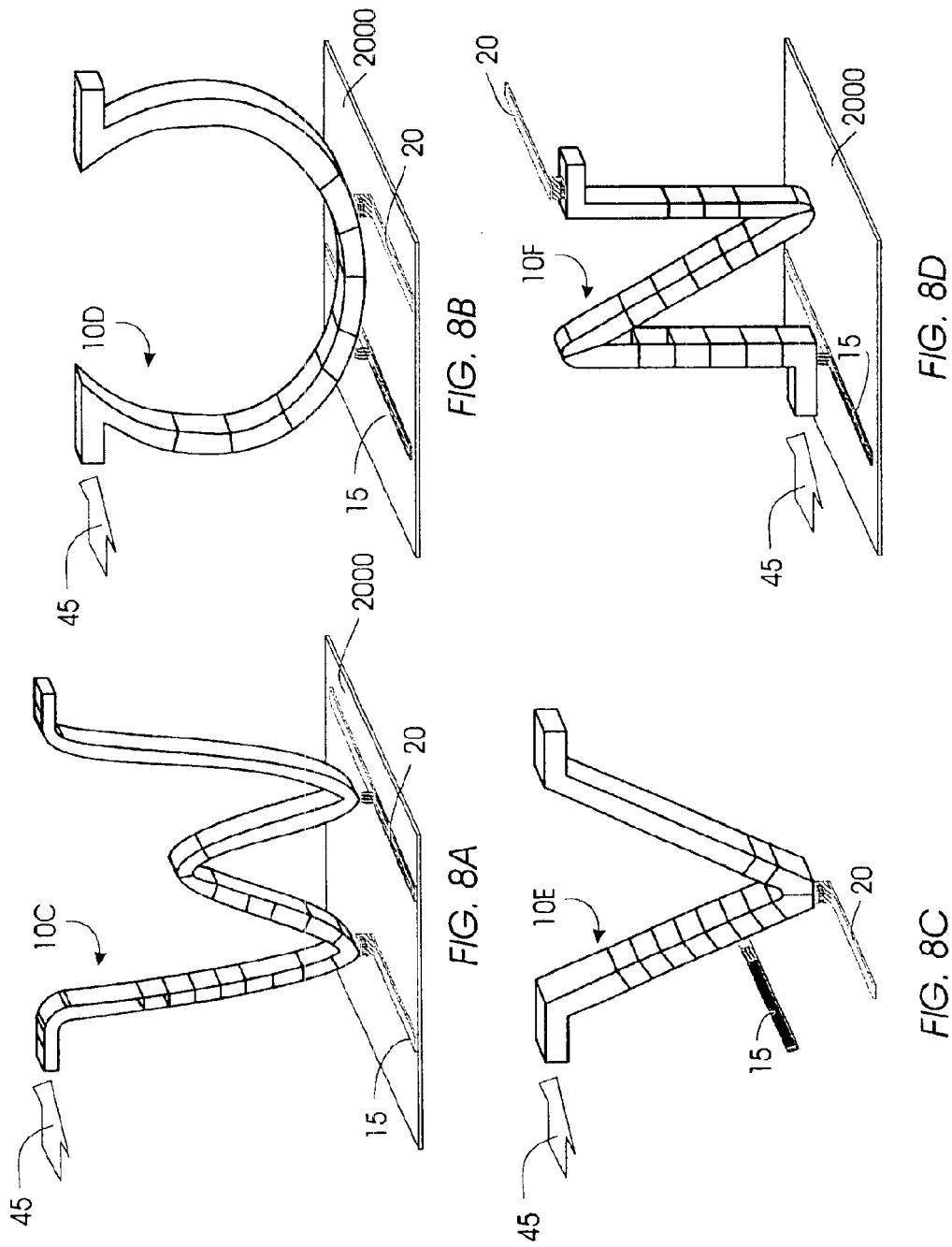

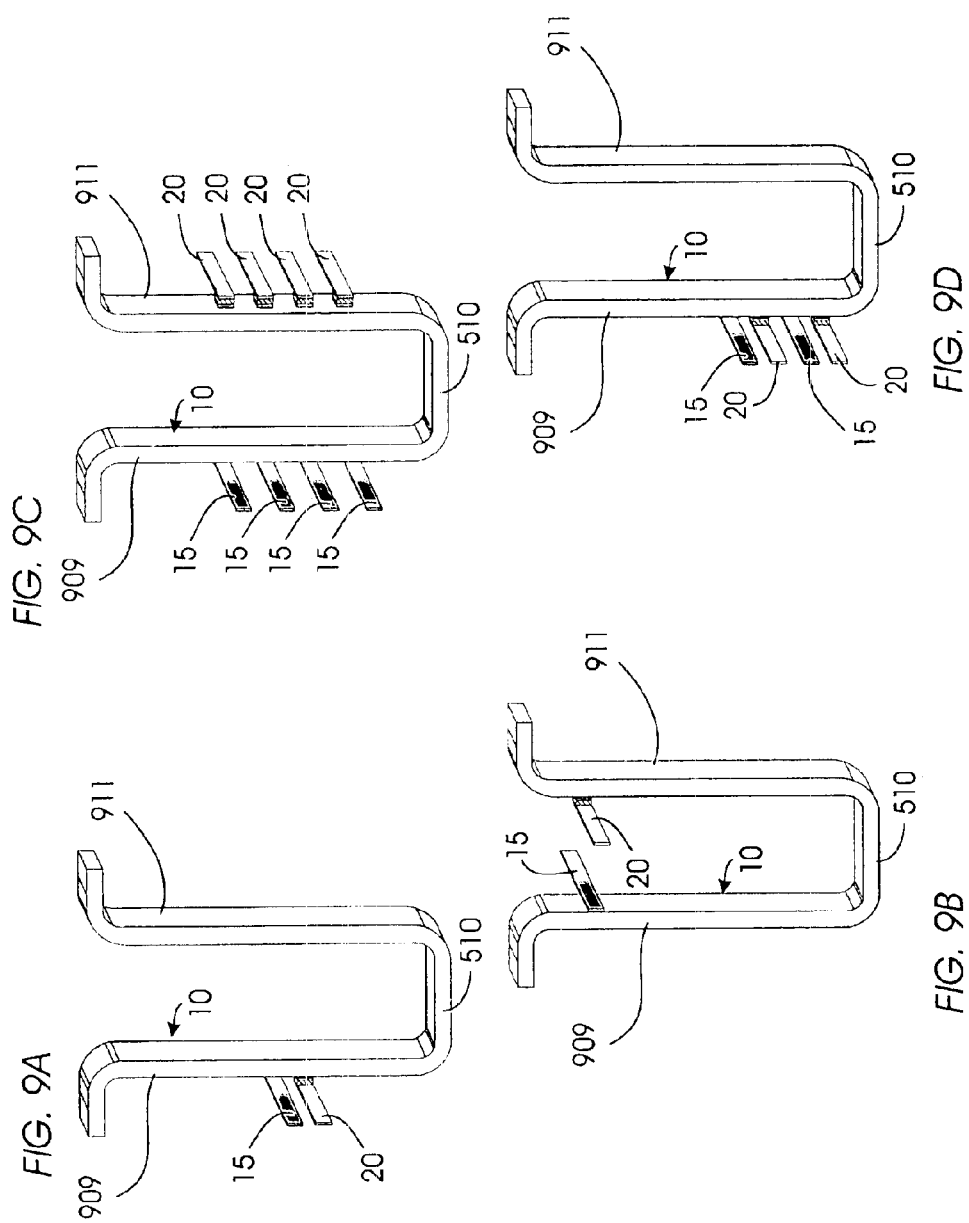

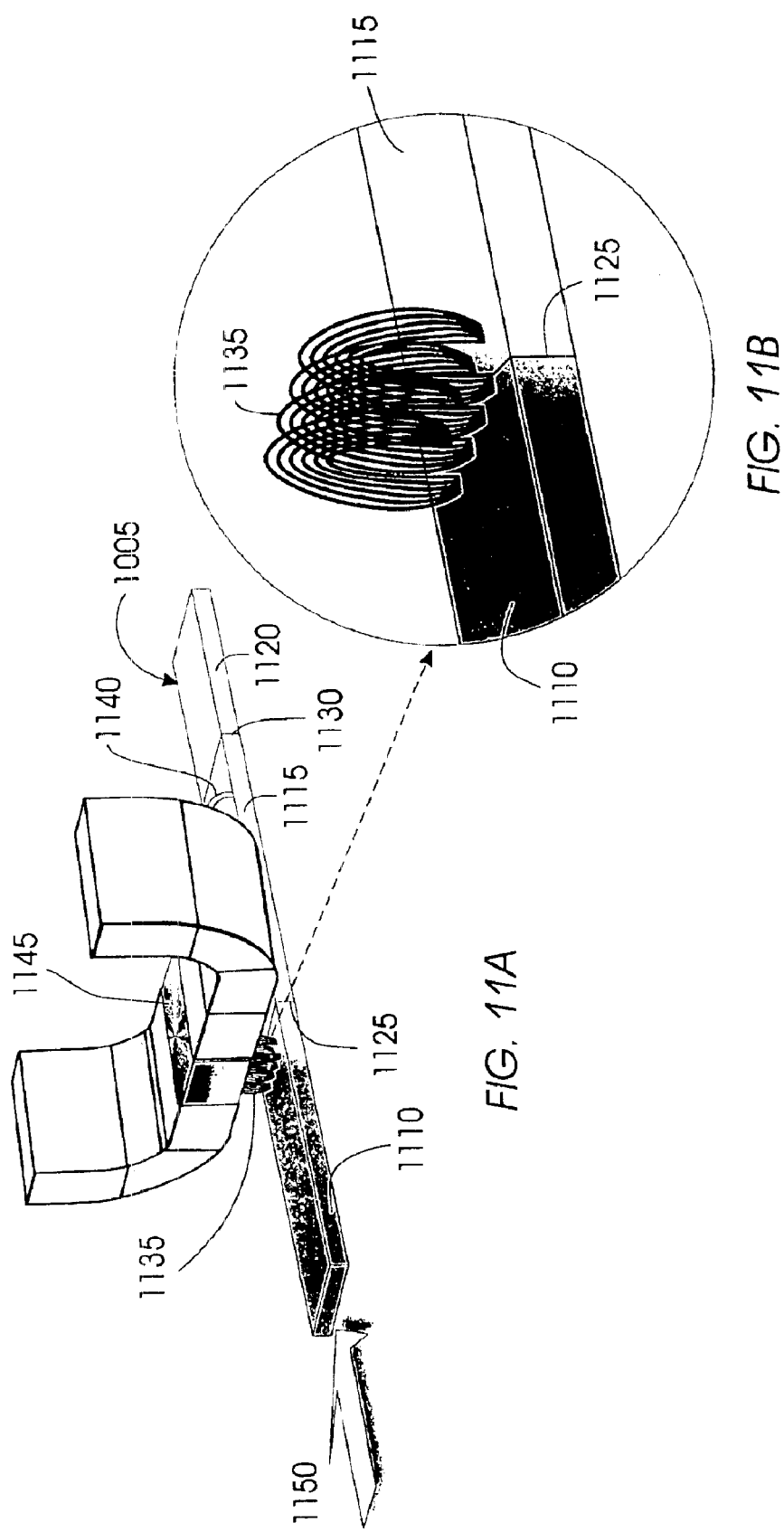

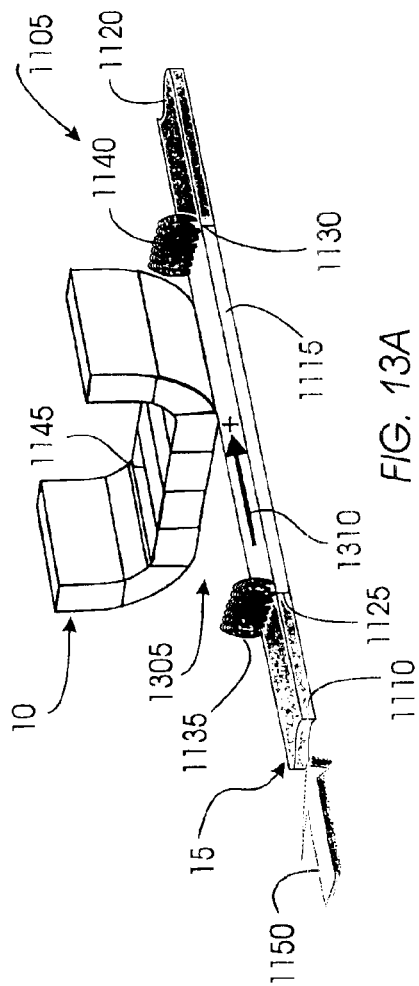
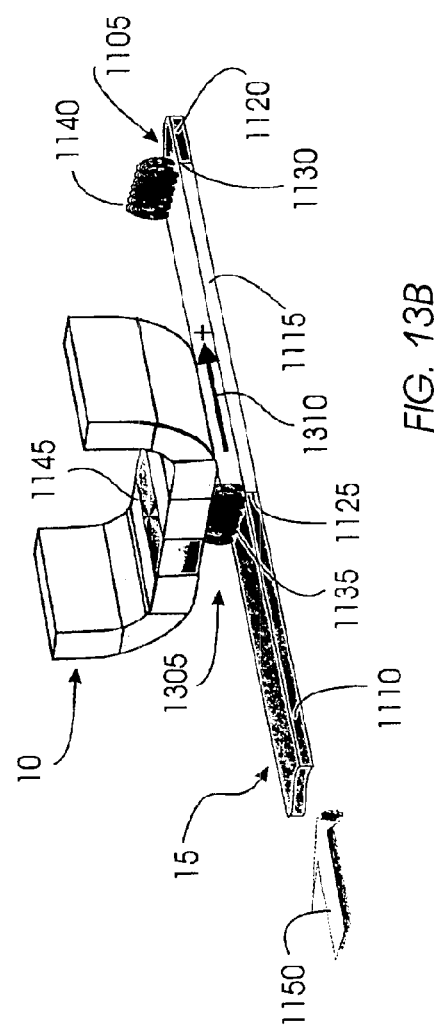

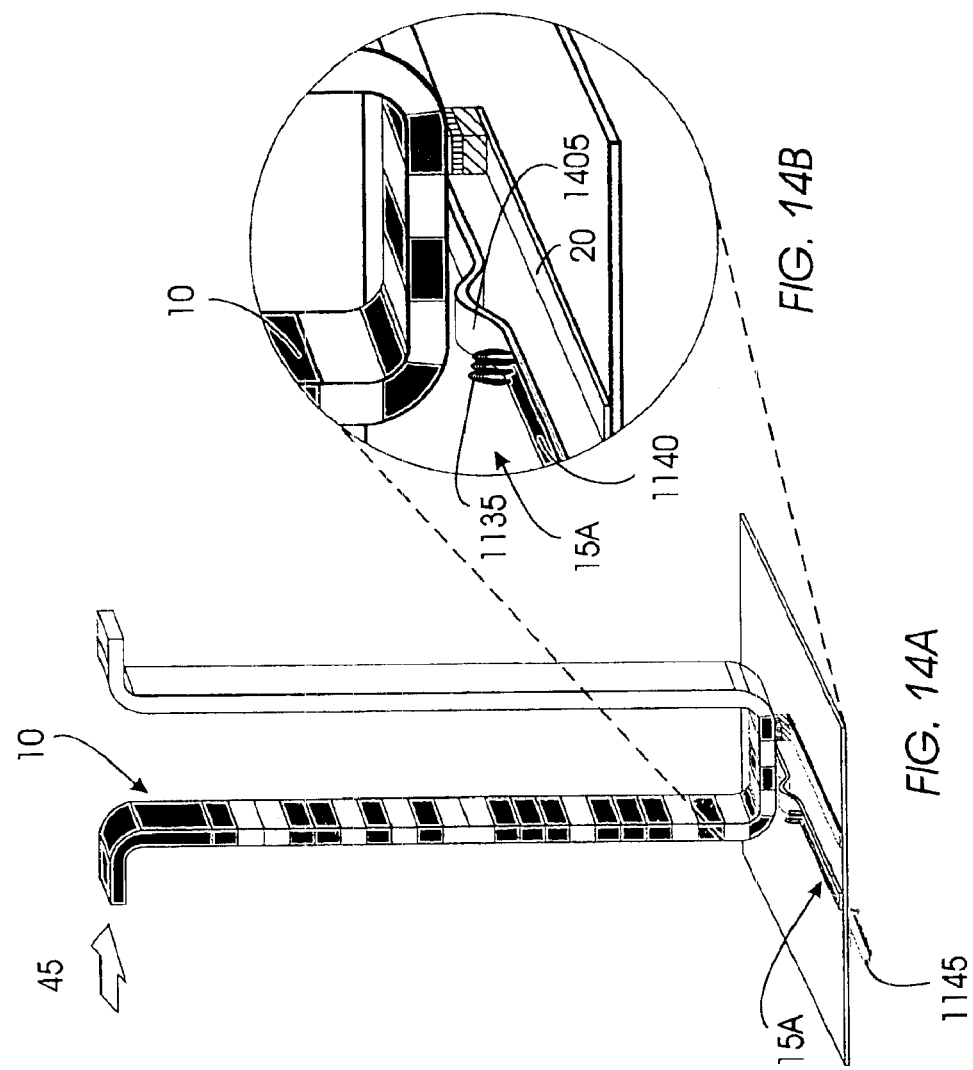

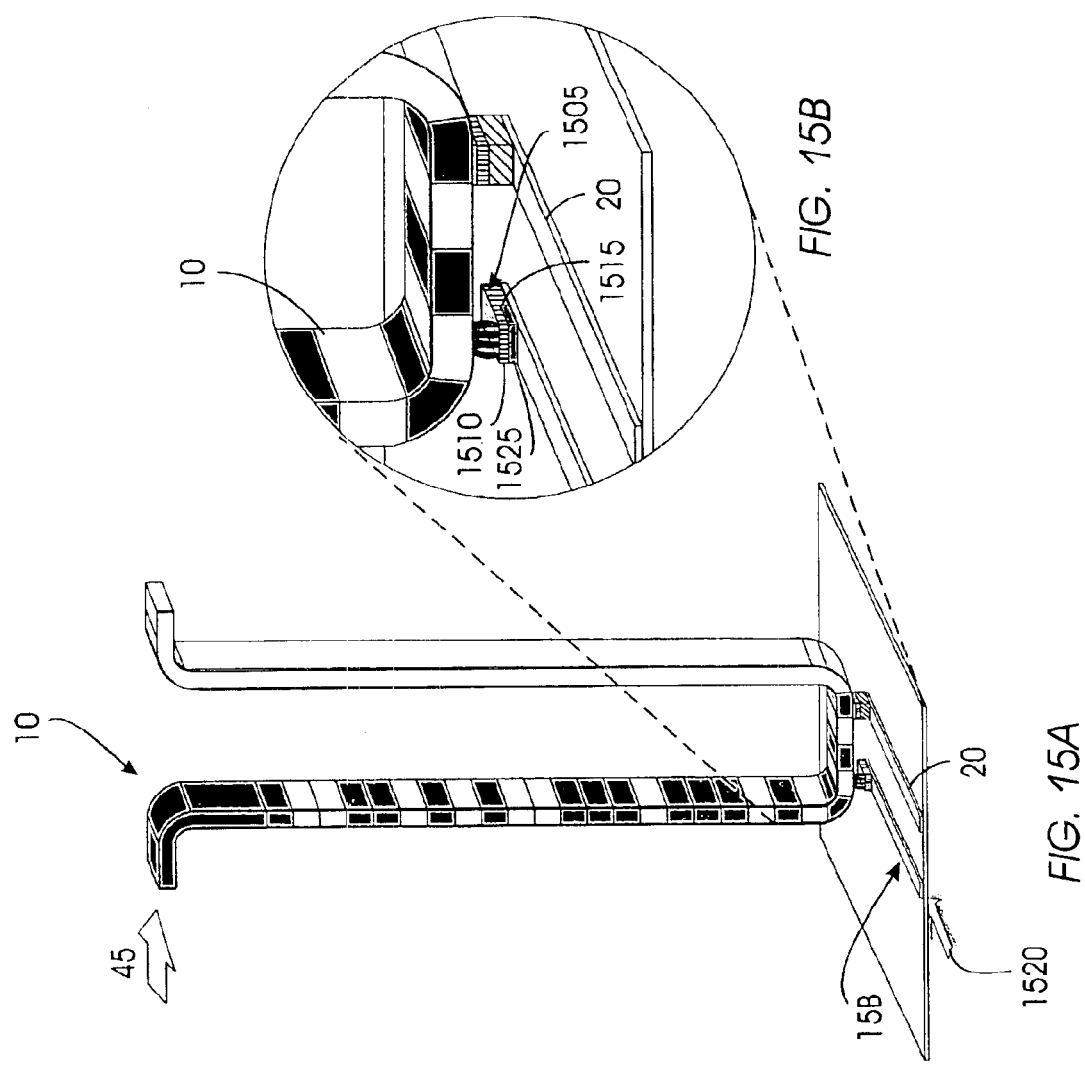

SYSTEM AND METHOD FOR WRITING TO A MAGNETIC SHIFT REGISTER

CROSS-REFERENCE TO RELATED APPLICATION

The present application is related to co-pending U.S. patent application titled "Shiftable Magnetic Shift Register and Method of Using the Same," which was filed on even date herewith, which is assigned to the same assignee as the present application, and which is incorporated herein by reference.

FIELD OF THE INVENTION

The present invention generally relates to memory storage systems, and particularly to a memory storage system that uses the magnetic moment of magnetic domains to store data. Specifically, the present invention relates to a system that uses fringing fields associated with domain walls for writing to such a memory storage system.

BACKGROUND OF THE INVENTION

The two conventional common non-volatile data storage devices are: disk drives and solid state random access memories (RAM). Disk drives are capable of inexpensively storing large amounts of data, i.e., greater than 100 GB. However, disk drives are inherently unreliable. A hard drive includes a fixed read/write head and a moving media upon which data is written. Devices with moving parts tend to wear out and fail. Solid state random access memories currently store data on the order of 1 GB (gigabyte) per device, and are relatively expensive, per storage unit, i.e., per 1 GB, compared to a disk drive.

The most common type of solid state RAM is Flash memory. Flash memory relies on a thin layer of polysilicon that is disposed in oxide below a transistor's on-off control gate. This layer of polysilicon is a floating gate, isolated by the silicon from the control gate and the transistor channel. Flash memory is relatively slow, with reading or writing times on the order of a microsecond. In addition, flash memory cells could begin to lose data after less than a million write cycles. While this may be adequate for some applications, flash memory cells would begin to fail rapidly if used constantly to write new data, such as in a computer's main memory. Further, the access time for flash memory is much too long for computer applications.

Another form of RAM is the ferroelectric RAM, or FRAM. FRAM stores data based on the direction that ferroelectric domains point. FRAM has access times much faster than Flash memory and consumes less energy than standard dynamic random access memory (DRAM). However, commercially available memory capacities are currently low, on the order of 0.25 MB (megabyte). In addition, memory storage in a FRAM relies on physically moving atoms, leading to eventual degradation of the medium and failure of the memory.

Yet another form of RAM is the Ovonic Unified Memory (OUM), which utilizes a material that alternates between crystalline and amorphous phases to store data. The material used in this application is a chalcogenide alloy. After the chalcogenide alloy experiences a heating and cooling cycle, it could be programmed to accept one of two stable phases: polycrystalline or amorphous. The variation in resistance of the two phases leads to the use of the chalcogenide alloy as memory storage. Data access time is on the order of 50 ns.

However, the size of these memories is still small, on the order of 4 MB currently. In addition, OUM relies on physically changing a material from crystalline to amorphous; which likely causes the material to eventually degrade and fail.

Semiconductor magnetoresistive RAM (MRAM) stores data as direction of magnetic moment in a ferromagnetic material. Atoms in ferromagnetic materials respond to external magnetic fields, aligning their magnetic moments to the direction of the applied magnetic field. When the field is removed, the atoms' magnetic moments still remain aligned in the induced direction. A field applied in the opposite direction causes the atoms to realign themselves with the new direction. Typically, the magnetic moments of the atoms within a volume of the ferromagnetic material are aligned parallel to one another by a magnetic exchange interaction. These atoms then respond together, largely as one macromagnetic moment, or magnetic domain, to the external magnetic field One approach to MRAM uses a magnetic tunneling junction as the memory cell. The magnetic tunneling junction comprises two layers of ferromagnetic material separated by a thin insulating material. The direction of the magnetic domains is fixed in one layer. In the second layer, the domain direction is allowed to move in response to an applied field. Consequently, the direction of the domains in the second layer can either be parallel or opposite to the first layer, allowing the storage of data in the form of ones and zeros. However, currently available MRAM can only store up to 1 Mb (megabit), much less than needed for most memory applications. Larger memories are currently in development. In addition, each MRAM memory cell stores only one bit of data, thereby limiting the maximum possible memory capacity of such devices.

What is also needed is a writing element capable of writing to small discrete regions, or domains, of a magnetic material such as a magnetic shift register. This writing element should be able to write to the domain by changing the direction of the magnetic moment of the domain of the magnetic shift register. The writing element should be able to predictably induce a magnetic moment direction as directed by some external command or control. The need for such a writing element has heretofore been unsatisfied.

SUMMARY OF THE INVENTION

The present invention satisfies this need, and presents a system and an associated method (collectively referred to herein as "the system" or "the present system") for a magnetic shift register, writing device, and reading device. Briefly, the present system uses the inherent, natural properties of the domain walls in ferromagnetic materials to store data. The present system utilizes one read/write device to access numerous bits, on the order of 100 bits of data or more. Consequently, a small number of logic elements can access hundreds of bits of data.

The present system uses spin based electronics to write and read data in ferromagnetic material so that the physical nature of the material is unchanged in the magnetic shift register of the present invention. In one embodiment, a shiftable magnetic shift register comprises a data track formed of a fine wire or strip of material made of ferromagnetic material. The wire may be comprised of a physically uniform, magnetically homogeneous ferromagnetic material or layers of different ferromagnetic materials. Information is stored as direction of magnetic moment within the domains in the track. The wire can be magnetized in small sections in one direction or another.

An electric current is applied to the track to move the magnetic domains, along the track, in the direction of the electric current, past a reading or writing elements or devices. In a magnetic material with domain walls, a current passed across the domain wall moves the domain wall in the direction of the current flow. As the current passes through a domain, it becomes "spin polarized". When this spin polarized current passes into the next domain across a domain wall, it develops a spin torque. This spin torque moves the domain wall. Domain wall velocities can be very high, on the order of 100 m/sec.

In summary, a current passed through the track with a series of magnetic domains with alternating directions, can move these domains past the reading and writing elements. The reading device can then read the direction of the magnetic moments. The writing device can change the direction of the magnetic moments, thus writing information to the track.

According to a preferred embodiment of the present invention, one read/write element is dedicated to a single track, with the understanding that in other embodiments, more than one read and/or write elements could be assigned to one or more tracks.

Associated with each domain wall are large magnetic fringing fields. The domain wall concentrates the change in magnetism from one direction to another in a very small space. Depending on the nature of the domain wall, very large dipolar fringing fields can emanate from the domain wall. This characteristic of magnetic domains is used to write to the magnetic shift register. When the domain wall is moved close to another magnetic material, the large fields of the domain wall change the direction of the magnetic moment in the magnetic material, effectively "writing" to the magnetic material.

An important characteristic of domain wall fringing fields is that they are localized in small regions of space near the domain wall. Thus, domain wall fringing fields can provide highly localized and large magnetic fields that can be manipulated in space by moving or controlling the position of the domain wall within a magnetic entity such as a magnetic wire. Since the magnitude of the fringing fields drops rapidly with distance from the domain wall, application of the domain wall fringing fields can be controlled in wires by varying the distance of the wire from the material, whose property is to be changed by the domain wall fringing field and by moving the domain wall along the wire.

This concept for using fringing fields to write to a magnetic material can be applied to many different applications using spintronics, including but not limited to: magnetic random access memories; magnetic recording hard disk drives; magnetic logic devices; security cards using magnetically stored information; semiconductor devices wherein large magnetic fields provided by domain wall fringing fields can be used to locally vary the electronic properties of the semiconductor or semiconductor heterostructure; mesoscopic devices, which are sufficiently small that the electronic energy levels, therein, can be substantially affected by the application of local magnetic fields; and so forth.

For applications involving the manipulation of spin-polarized current in semiconductors, spin-polarized current is injected into a semiconductor or semiconductor heterostructure, and then is manipulated as desired, according to the specific application in which the present invention is used. If a very large local magnetic field is applied to the semiconductor, certain electronic levels in the semiconductor can be spin-split, changing the electronic state of the semiconductor. For example, the electronic state of the semiconductor can be changed from being conductive to being non-conductive. Consequently, the use of a device such as the fringing field write device can be used to switch a semiconductor from "on" to "off".

The influence of a magnetic field on a semiconductor or semiconductor heterostructure is determined, in large part, by the gyromagnetic ratio, g-factor, of the semiconductor. The larger the g-factor, the larger is the affect of the magnetic field on the electronic properties of the semiconductor. So, it may be advantageous, to use the present system in conjunction with semiconducting materials with large g-factors.

Reading the data on the magnetic shift register can be accomplished, for example, using standard technology such as a magnetic tunneling junction. A magnetic tunneling junction has two magnetic materials separated by a very thin insulating layer, or tunneling barrier. The magnitude of any current passed through the tunneling barrier depends on the relative magnetic orientation of the two magnetic materials in the tunneling junction. Consequently, the value of the current in the tunneling junction indicates the direction of the magnetic moment in the magnetic shift register that is being read. For further details about the design and performance of the magnetic tunneling junction and the exchange biased magnetic tunnel junction, reference is made to U.S. Pat. Nos. 5,650,958; 5,729,410; and 5,801,984, that are incorporated herein by reference.

By incorporating the magnetic shift register as part of the magnetic tunneling junction, information stored in the domains in the magnetic shift register could be read by the current that passes through the magnetic tunnel junction. As the domains flow pass the magnetic tunneling junction, the magnitude of the current indicates the value stored by the direction of the domain. Moving the domains around the magnetic shift register brings the chosen domain to the magnetic tunneling junction for reading purposes.

The magnetic shift register described herein, presents numerous advantages over other forms of solid state memory and magnetic recording hard disk drives. In particular, the magnetic shift register provides a means of accessing hundreds of data bits using a small number of logic gates and circuit elements. Thus, the magnetic shift register can provide capacious amounts of storage comparable to those provided in conventional hard disk drives but without any moving parts and at a comparable cost of such hard disk drives.

Similarly, compared to conventional solid state memory devices, the magnetic shift register provides far higher memory capacities but at a fraction of the cost per bit of conventional solid state memories. This advantage is achieved because the magnetic shift register can be fabricated using standard CMOS processes and methods of manufacture but the magnetic shift register stores hundreds of data bits for the same area of silicon in which a conventional CMOS solid state memory would store one or a small number of bits.

This latter advantage is realized because the magnetic shift register uses the third dimension out of the plane of the silicon substrate to store data in largely vertical tracks which occupy little space on the silicon substrate. Since the cost of CMOS logic and memory is largely determined by the area of silicon used in any given technology node the magnetic shift register can thereby provide a far cheaper means of storing data than conventional solid state memories.

The magnetic shift register can thus be used to replace many existing data storage devices, including but not limited to magnetic recording hard disk drives, and many solid state memories such as DRAM, SRAM, FeRAM, MRAM etc.

The capacity of the magnetic shift register can be varied over a wide range continuously by simply varying the number of magnetic shift register tracks per memory device. This is a particular advantage over magnetic hard disk drives in which because of the high cost of the reading and writing heads and their circuitry, and the high cost of the mechanical means of moving these heads and the magnetic media, a hard disk drive only provides a cheap means of storage when many gigabytes of data are stored, such that the cost of the mechanical components of the hard disk drive is amortized over the large number of data bits.

By contrast, the magnetic shift register can be built at low cost per bit in much smaller sizes, thereby allowing the magnetic shift register to be used for a wide range of applications where the data storage capacity required is much lower than that of a magnetic hard disk drive. Thus the magnetic shift register can be used for various electronic devices including by way of example, but not limited to: digital cameras, personal digital assistants, security devices, memory sticks, removable storage devices, and so forth.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 4C is a schematic diagram of another embodiment of the shift register of FIG. 1, illustrating a well or bottom section of the shift register as being composed of a single ferromagnetic material;

FIG. 9 is comprised of FIGS. 9A, 9B, 9C, and 9D, and represents schematic diagrams illustrating various embodiments of placements for the writing and reading devices of the magnetic memory system of FIG. 1;

FIG. 11 is comprised of FIGS. 11A and 11B, and represents a schematic diagram of the writing device of FIG. 1;

FIG. 14 is comprised of FIGS. 14A and 14B, and represents a configuration of an alternative embodiment of the writing device of FIG. 1, using a bend in the track of the writing device;

FIG. 15 is comprised of FIGS. 15A and 15B, and represents a configuration of an alternative embodiment of the writing device of FIG. 1, using a block of ferromagnetic material;

DETAILED DESCRIPTION OF PREFERRED EMBODIMENTS

Figure 1:
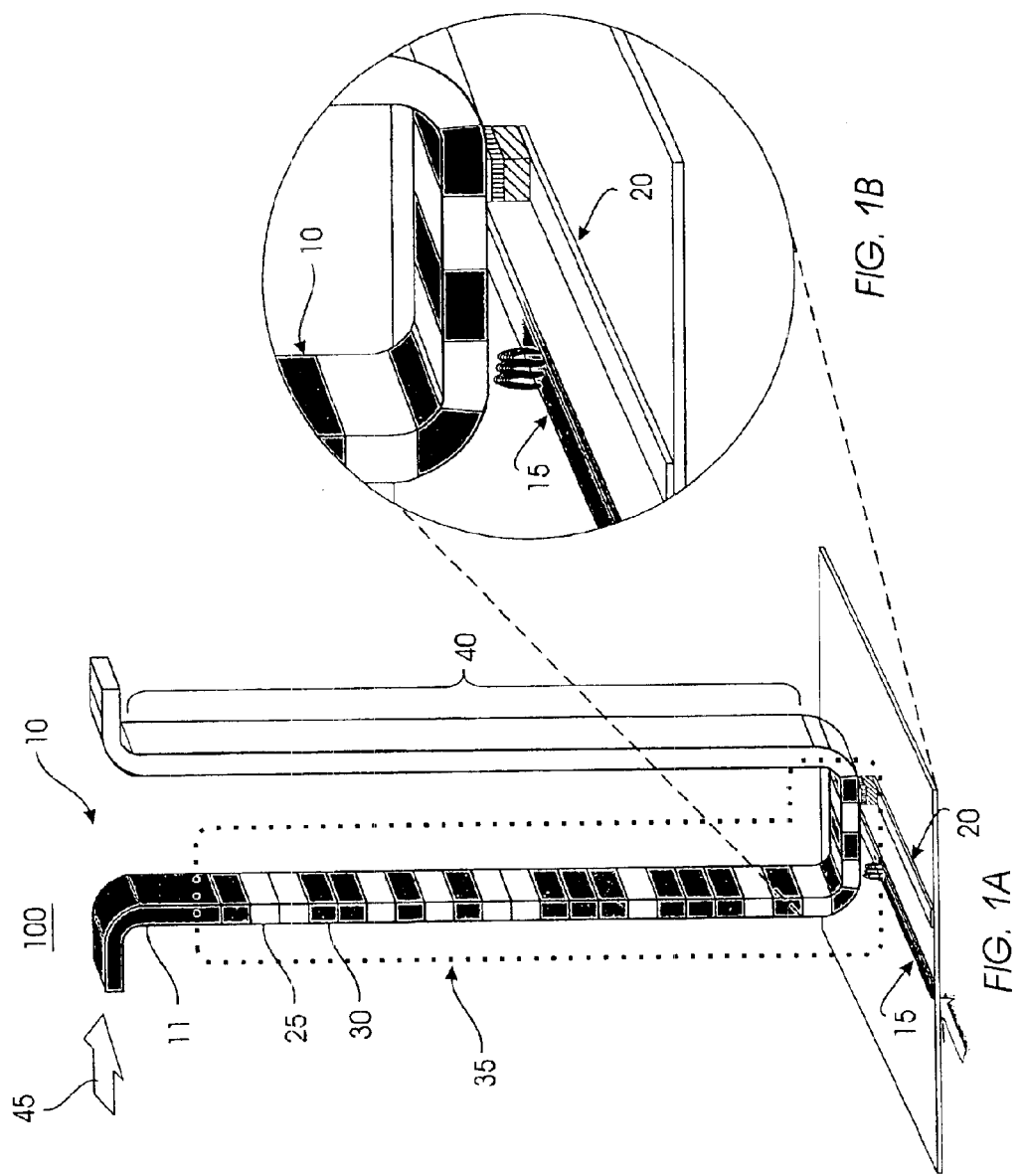
FIG. 1 is comprised of FIGS. 1A and 1B, and represents an exemplary operating environment in which a writing element is used to write data to a magnetic shift register according to the present invention.

FIG. 1 (FIGS. 1A and 1B) illustrates an exemplary high-level architecture of a magnetic memory system 100 comprising a magnetic shift register 10 that utilizes a writing device (also referred to herein as writing element) 15 and a reading device (also referred to herein as reading element) 20. Both the reading device 20 and the writing device 15 form a read/write element of system 100.

The magnetic shift register 10 comprises a fine track 11 made of ferromagnetic material. The track 11 can be magnetized in small sections, or domains, in one direction or another. Information is stored in regions such as domains 25, 30 in the track 11. The order parameter of the magnetic material from which the track is fabricated, that is the magnetization direction or the direction of the magnetic moment, changes from one direction to another. This variation in the direction of the magnetic moment forms the basis for storing information in the track 11.

In one embodiment, the magnetic shift register 10 comprises a data region 35 and a reservoir 40. The data region 35 comprises a contiguous set of domains such as domains 25, 30 that store data. Additional length is provided to the magnetic shift register 10 in the form of a reservoir 40.

The reservoir 40 is made sufficiently long so that it accommodates all the domains in the region 35 when these domains are moved completely from region 35 across the writing and reading elements for the purposes of writing and reading domains into region 40. At any given time, the domains are thus stored partially in region 35 and partially in region 40 so it is the combination of region 35 and region 40 that forms the storage element. In one embodiment, the reservoir 40 is wherein the reservoir region is devoid of magnetic domains in a quiescent state.

Thus, the storage region 35 at any given time may be located within a different portion of the magnetic shift register 10 and the reservoir 40 would be divided into two regions on either side of the storage region 35. Although the storage region 35 is one contiguous region, and in one embodiment of this application the spatial distribution and extent of the domains within the storage region 35 would be approximately the same no matter where the storage region 35 resides within the shift register 10, in another embodiment portions of the storage region may be expanded during the motion of this region particularly across the reading and writing elements. A portion or all of the data region 35 is moved into the reservoir 40 to access data in specific domains.

The reservoir 40 is shown in FIG. 1 as approximately the same size as the data region 35. However, other alternative embodiments may allow the reservoir 40 to have a different size than the data region 35. As an example, the reservoir 40 could be much smaller than the data region 35 if more than one reading and writing element were used for each magnetic shift register. For example, if two reading and writing elements were used for one shift register and were disposed equally along the length of the data region then the reservoir would only need to be approximately half as long as the data region.

An electric current 45 is applied to the track 11 to move the magnetic moments within domains 25, 30, along the track 11, past the reading device 20 or the writing device 15. In a magnetic material with domain walls, a current passed across the domain walls moves the domain walls in the direction of the current flow. As the current passes through a domain, it becomes "spin polarized". When this spin polarized current passes through into the next domain across the intervening domain wall, it develops a spin torque. This spin torque moves the domain wall. Domain wall velocities can be very high, i.e., on the order of 100 m/sec, so that the process of moving a particular domain to the required position for the purposes of reading this domain or for changing its magnetic state by means of the writing element can be very short.

Figure 2:
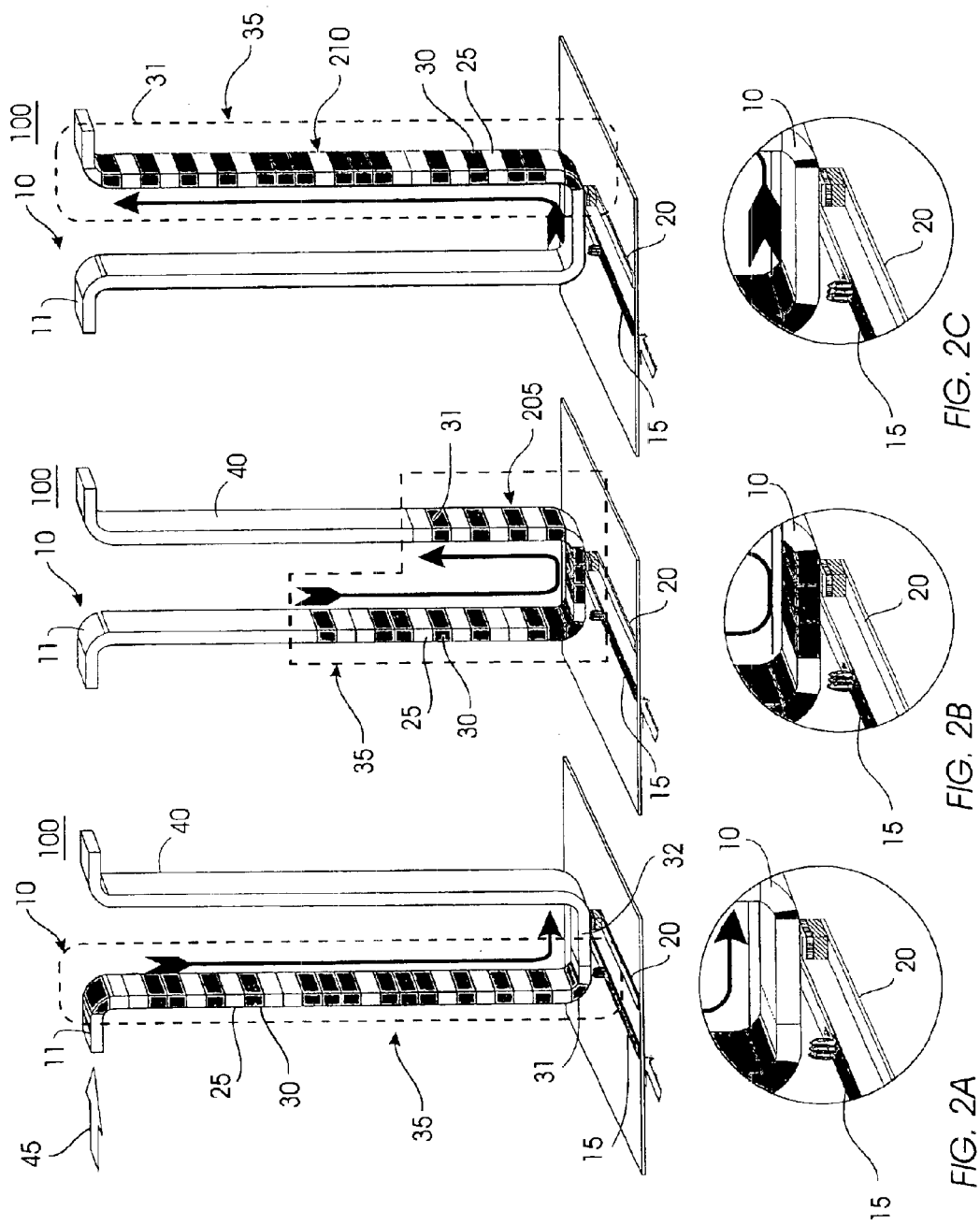
FIG. 2 is comprised of FIGS. 2A, 2B, and 2C and represents a schematic diagram illustrating a method of operation of the magnetic shift register of FIG. 1.

The domains, such as domains 25, 30, 31 are moved (or shifted) back and forth over the writing device 15 and reading device 20, in order to move the data region 35 in and out of the reservoir 40, as shown in FIG. 2 (FIGS. 2A, 2B, 2C). In the example of FIG. 2A, the data region 35 could initially reside on the left side of the well, i.e., bottom section 32, of the magnetic shift register 10, with no domains in the reservoir 40. FIG. 2C shows the case where the data region 35 resides entirely on the right side of the magnetic shift register 10.

In order to write data in a specific domain, such as domain 31, a current 45 is applied to the magnetic shift register 10 to move domain 31 over, and in alignment with the writing device 15. All the domains in the data region 35 move when the current is applied to the magnetic shift register.

The movement of the domains is controlled by both the magnitude and direction of the current, and the time over which the current is applied. In one embodiment, one current pulse of a specified shape (magnitude versus time) and duration, is applied to move the domains in the storage region in one increment or step. A series of pulses are applied to move the domains the required number of increments or steps. Thus, a shifted portion 205 (FIG. 2B) of the data region 35 is pushed (shifted or moved) into the reservoir region 40. The direction of motion of the domains within the track 11 depends on the direction of the applied current.

In order to read data in a specific domain, such as domain 25, additional current is applied to the magnetic shift register 10 to move domain 25 over, and in alignment with the reading device 20. A larger shifted portion 210 of the data region 35 is pushed (shifted or moved) into the reservoir 40.

The reading and writing devices shown in FIGS. 1 and 2, form part of a control circuit that defines a reference plane in which the reading and writing devices are arrayed. In one embodiment, the magnetic shift register 10 stands vertically out of this reference plane, largely orthogonal to this plane.

In order to operate the magnetic shift register 10 the control circuit includes, in addition to the reading and writing elements, logic and other circuitry for a variety of purposes, including the operation of the reading and writing devices, the provision of current pulses to move the domains within the shift register, the means of coding and decoding data in the magnetic shift register etc. In one embodiment the control circuit is fabricated using CMOS processes on a silicon wafer. The magnetic shift registers will be designed to have a small footprint on the silicon wafer so as to maximize the storage capacity of the memory device whilst utilizing the smallest area of silicon to keep the lowest possible cost.

In the embodiment shown in FIG. 1 the footprint of the shift register will be determined largely by the area of the wafer that the reading and writing devices occupy. Thus, the magnetic shift register will be comprised of tracks extending largely in the direction out of the plane of the wafer. The length of the tracks in the vertical direction will determine the storage capacity of the shift register. Since the vertical extent can be much greater than the extent of the track in the horizontal direction hundreds of magnetic bits can be stored in the shift register yet the area occupied by the shift register in the horizontal plane is very small. Thus, the shift register can store many more bits for the same area of silicon wafer as compared to conventional solid state memories.

Although the tracks of the magnetic shift register are shown as being largely orthogonal to the plane of the reading and writing elements (the circuitry plane) these tracks can also be inclined, at an angle, to this reference plane, as an example, for the purpose of greater density or for ease of fabrication of these devices.

Figure 3:
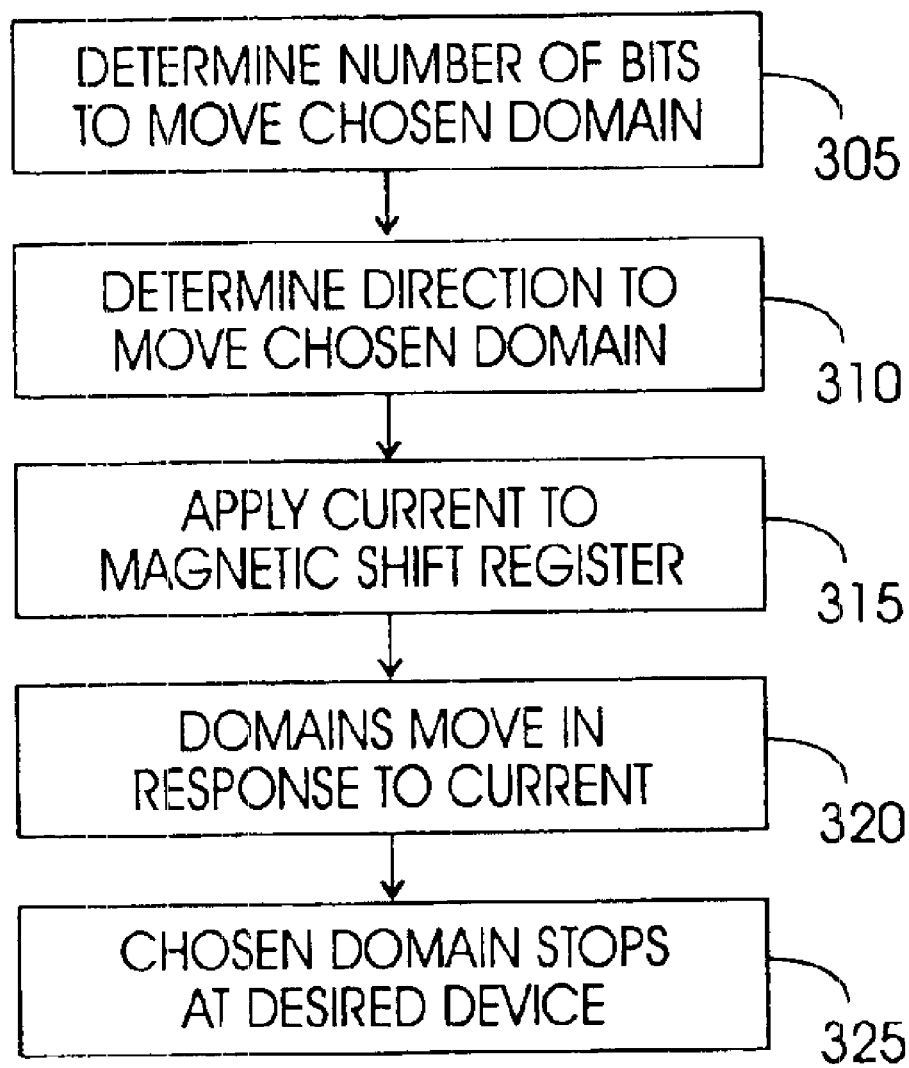
FIG. 3 is a process flow chart illustrating a method of operation of the magnetic shift register of FIG. 1.

A method 300 of operating the magnetic shift register 10 is illustrated in FIG. 3, with further reference to FIG. 2 (FIGS. 2A, 2B, and 2C). For illustration purpose, a memory system 100 utilizing the magnetic shift register 10 wishes to either read the data in domain 25 or write data to domain 25 (refer to FIG. 2A).

At block 305, the memory system 100 determines the number of bits required to move domain 25 to either the writing device 15 or reading device 20. The memory system 100 also determines the direction required to move domain 25 in bock 310. In FIG. 2A, domain 25 is on the left of the writing device 15 and the reading device 20. A positive current 45 might be required to move domain 25 to the right, for example, while a negative current 45 might be required to move domain 25 to the left.

The memory system 100 then applies the desired current 45 to the magnetic shift register 10 at block 315. Current 45 may be one pulse or a series of pulses, moving the domain 25 one bit at a time. It is also possible to vary the length of duration or the magnitude of the current within the pulse or the pulse shape (current versus time within the pulse), to cause the domain 25 within the storage region 35 to move by several increments during the application of one pulse. The domains in the data region 35 move in response to the current 45 in block 320. Domain 25 stops at the desired device, i.e., writing device 15 or reading device 20 (block 325).

Figure 4:
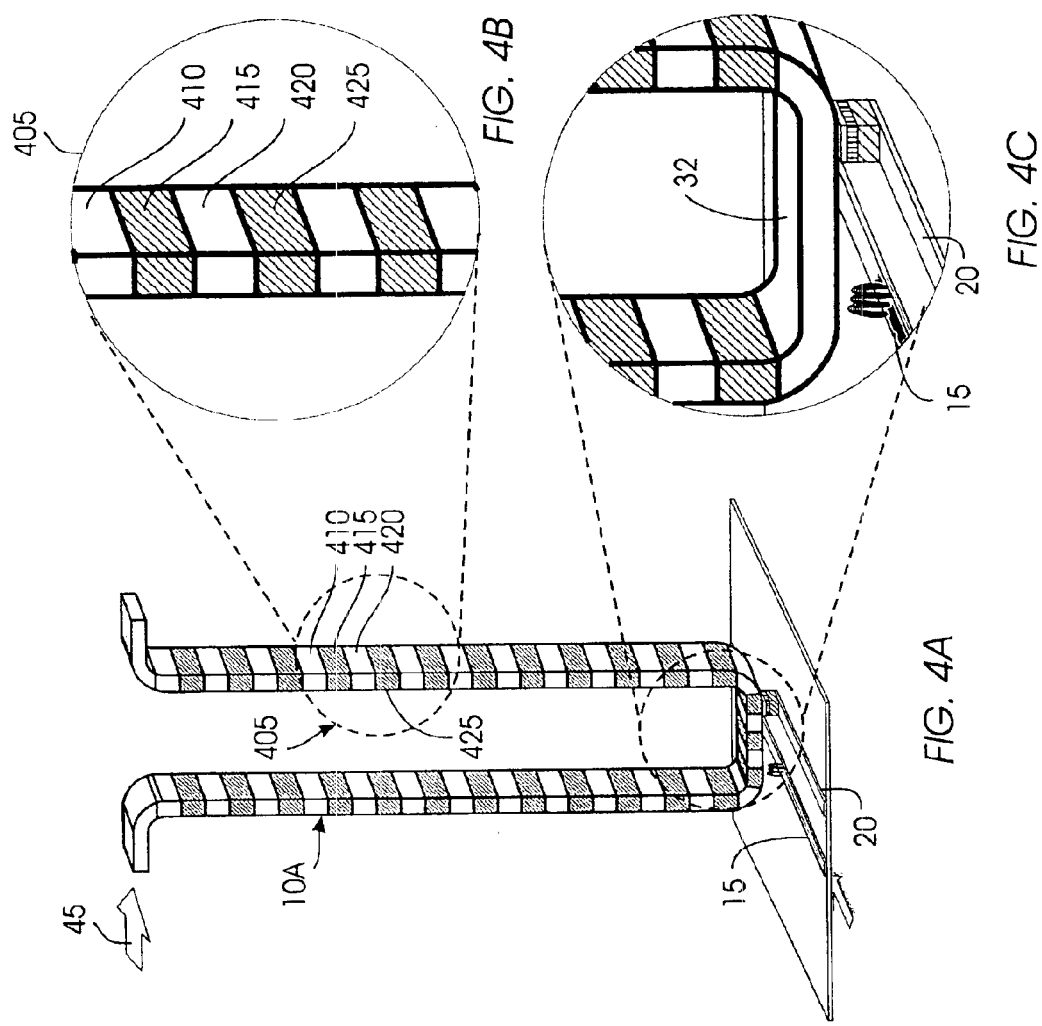
FIG. 4 is comprised of FIGS. 4A and 4B, and represents a schematic diagram illustrating an embodiment of the magnetic shift register of FIG. 1 constructed of multiple types of alternating ferromagnetic materials.

With reference to FIG. 4 (FIGS. 4A, 4B), an alternative magnetic shift register 10A may be constructed similarly to the shift register 10 of FIGS. 1 and 2, but made of alternating magnetic layers, to pin the possible locations of the domains within the magnetic shift register 10A. Pinning the possible locations of the domains prevents the designated domains from drifting.

The magnetic layers may be comprised of various ferromagnetic or ferrimagnetic materials where these magnetic materials are chosen appropriately based primarily on the magnitude of their magnetization (magnetic moment per unit volume), exchange parameter, magnetic anisotropy, and damping coefficient. The choice of these materials will also be influenced by their manufacturability and compatibility with the process used to fabricate the magnetic shift register.

As shown in region 405 of the shift register 10A, one type of magnetic material may be used for domains 410, 420, while a different type of magnetic material may be used for alternating domains 415, 425. In another embodiment, multiple types of magnetic materials may be used, in varying order of materials.

The introduction of different ferromagnetic layers in the magnetic shift register 10A creates local energy minimums, similar to "potential wells", so that the domain walls between domains of opposite polarity will align themselves with the boundaries between the alternating ferromagnetic layers 410, 415, etc. Thus, the extent and size of the domains will be determined by the thicknesses of the magnetic layers.

A current pulse 45 applied to the magnetic shift register 10A causes the domains 410–425 within the region 405 to move in the direction of the current 45. However, unless the current pulse 45 is of sufficient amplitude and duration, the domains 410–425 may not move past the boundaries between the two different types of magnetic material. Consequently, the data region 35 can be moved one bit at a time, and the domains are not allowed to drift past their desired positions.

In addition to pinning the possible locations of the domains, using different layers of magnetic material also allows higher tolerances for current amplitude and pulse duration. In this embodiment, the portion of the magnetic shift register 10A that passes over the writing device 15 and the reading device 20 can be a homogeneous magnetic material or layers of different magnetic materials as illustrated in FIG. 4C.

The length of the alternating magnetic regions 410, 420, etc. and 415, 425 etc. can be different. Moreover, although it may be preferred that the length of each type of magnetic region 410, 420, etc., and 415, 425, etc. be the same throughout the shift register, this is not essential, and these lengths can vary somewhat throughout the magnetic shift register. What is important is the potential that pins the domains in their defined positions against current induced motion induced by the current pulses.

Figure 5:
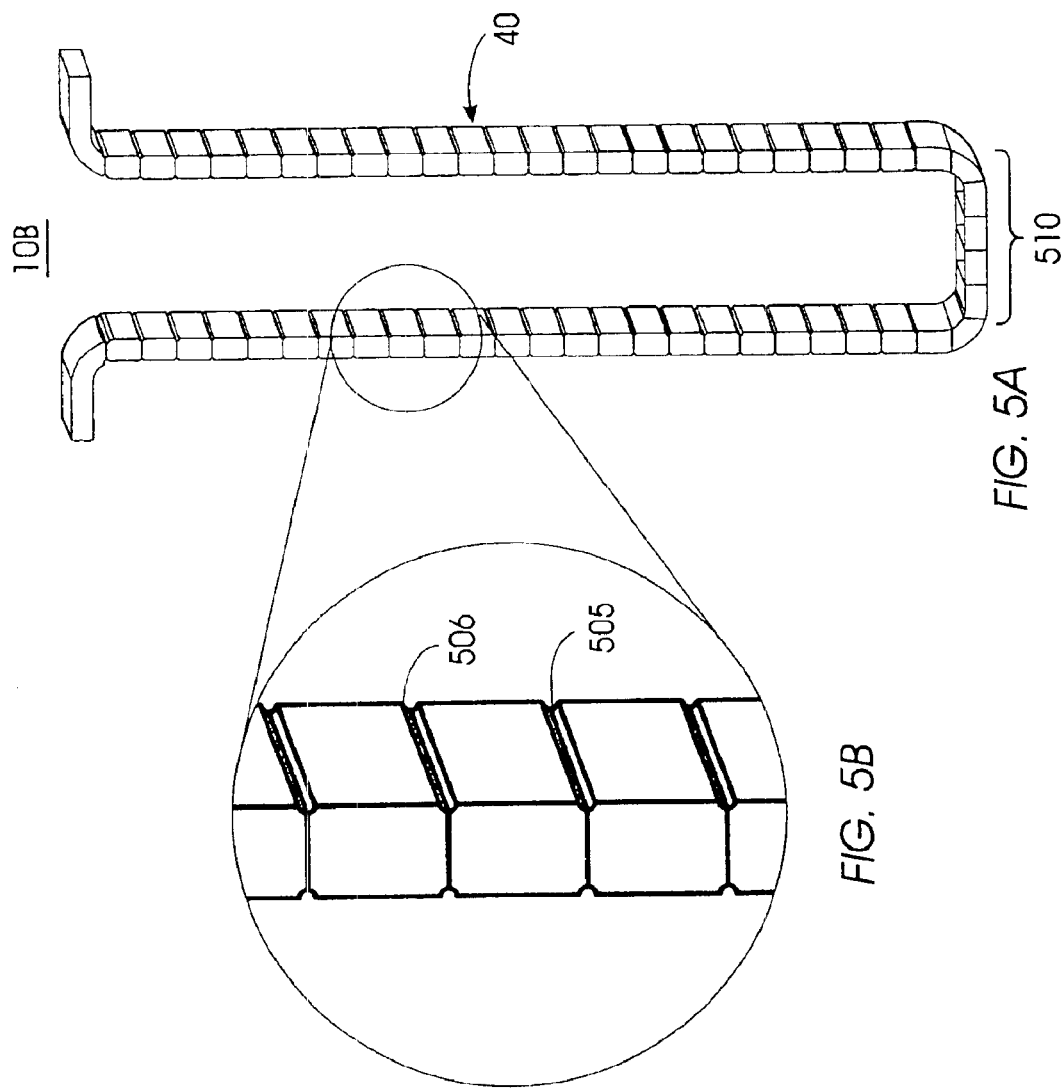
FIG. 5 is comprised of FIGS. 5A and 5B, and represents a schematic diagram illustrating an embodiment of the magnetic shift register of FIG. 1 constructed with indentations in a homogeneous ferromagnetic material.

With reference to FIG. 5 (FIGS. 5A, 5B), another magnetic shift register 10B that is made of homogeneous magnetic material can be made inhomogeneous by physically varying the width or the area of the track 11. Local energy minimums can be created within the magnetic shift register 10B by physically shaping the magnetic shift register 10B.

One possible shaping approach that is illustrated in FIG. 5, introduces indentations, such as indentations 505, 506 in the ferromagnetic material of the magnetic shift register 10B. The indentations 505, 506 may be either open, or filled with a material which may be metallic or insulating.

In one embodiment, these indentations 505, 506 can be placed at uniform spacings. In another embodiment, the spacings between these indentations 505, 506 may be non-uniform along the length of the magnetic shift register 10B. The indentations 505, 506 are aligned with each other on either side of the track 11. However, it may be easier to fabricate a magnetic shift register with indentations on only one side of the track. Since these indentations 505, 506 are used to pin the domain walls, only one indentation on one side of the track may provide a sufficient pinning potential. Indeed, indentations may be situated on one or two or more of any of the four sides of the track shown in FIG. 5.

In another embodiment, the indentations may be replaced with extrusions where the width of the track is locally increased and not decreased as for the indentations. What is required is a means of pinning the domains by changing the local potential for the domain walls.

In yet another embodiment, the width or area of the wire may be alternated in successive regions so that the wire is comprised of regions of alternating widths or areas.

The magnetic shift register does not need to be uniformly filled with indentations or extrusions or alternating magnetic regions along its length. The magnetic shift register need be filled with only sufficient such pinning sites, such that the storage region moves by only one, or a specified number of increments per current pulse. For example, only one pinning site per N domains may be sufficient where N may be more than 1.

The reservoir 40 may or may not include these indentations. A bottom section 510 of the magnetic shift register 10B that crosses the writing device 15 and the reading device 20 may or may not include these indentations 505, 506.

In a further embodiment, the magnetic shift register 10B may be made of a combination of different ferromagnetic materials with indentations 505, 506, combining the features of magnetic shift register 10A and 10B.

Figure 6:
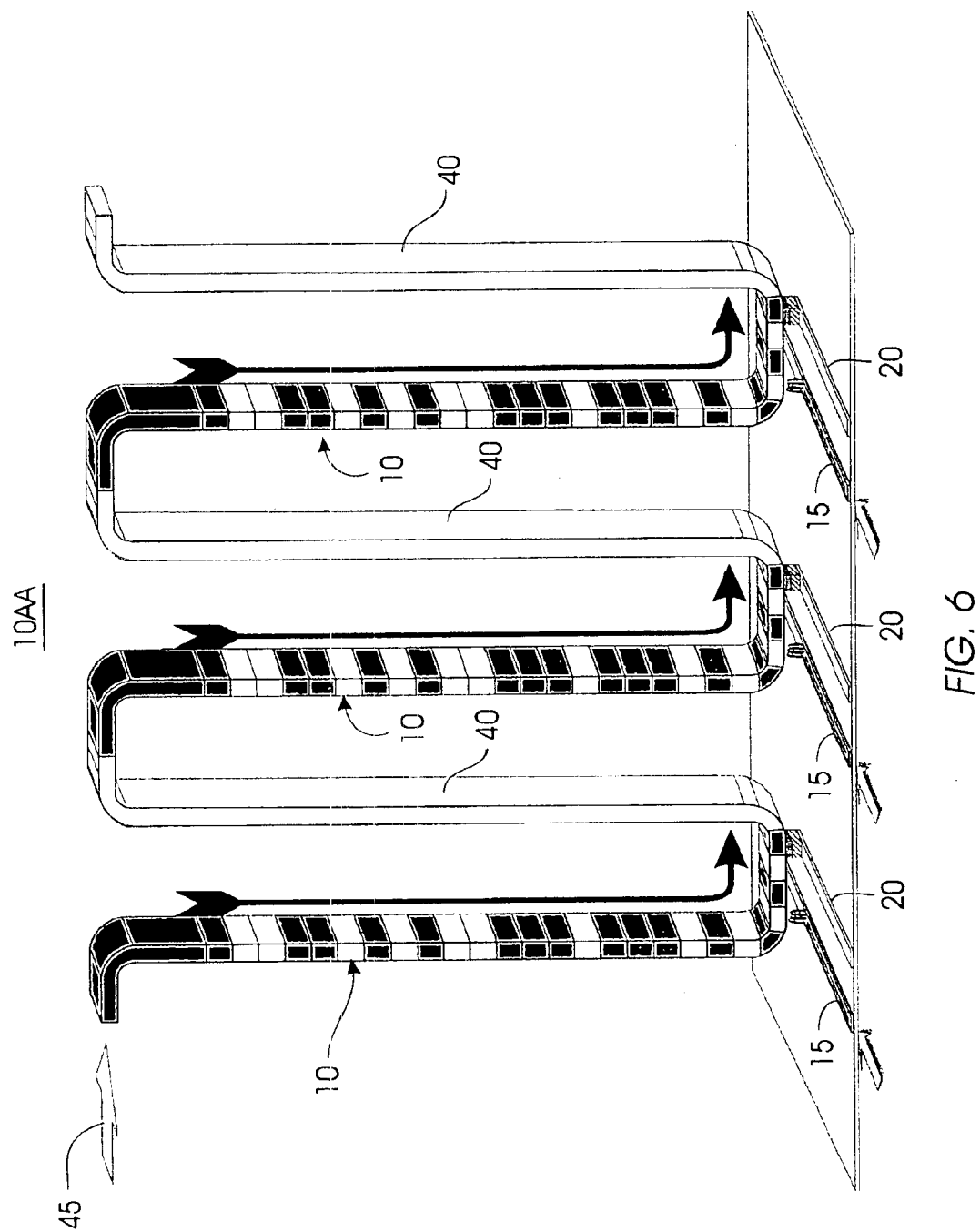
FIG. 6 is a schematic diagram illustrating an embodiment with parallel connections of magnetic shift registers of FIG. 1.

FIG. 6 illustrates a shift register 10AA according to another embodiment of the present invention. The shift register 10AA is comprised of a plurality of magnetic shift registers 10 (or a combination of other suitable shift registers described herein) that are connected in series. In this embodiment, the magnetic shift registers 10 are connected in series.

Figure 7:
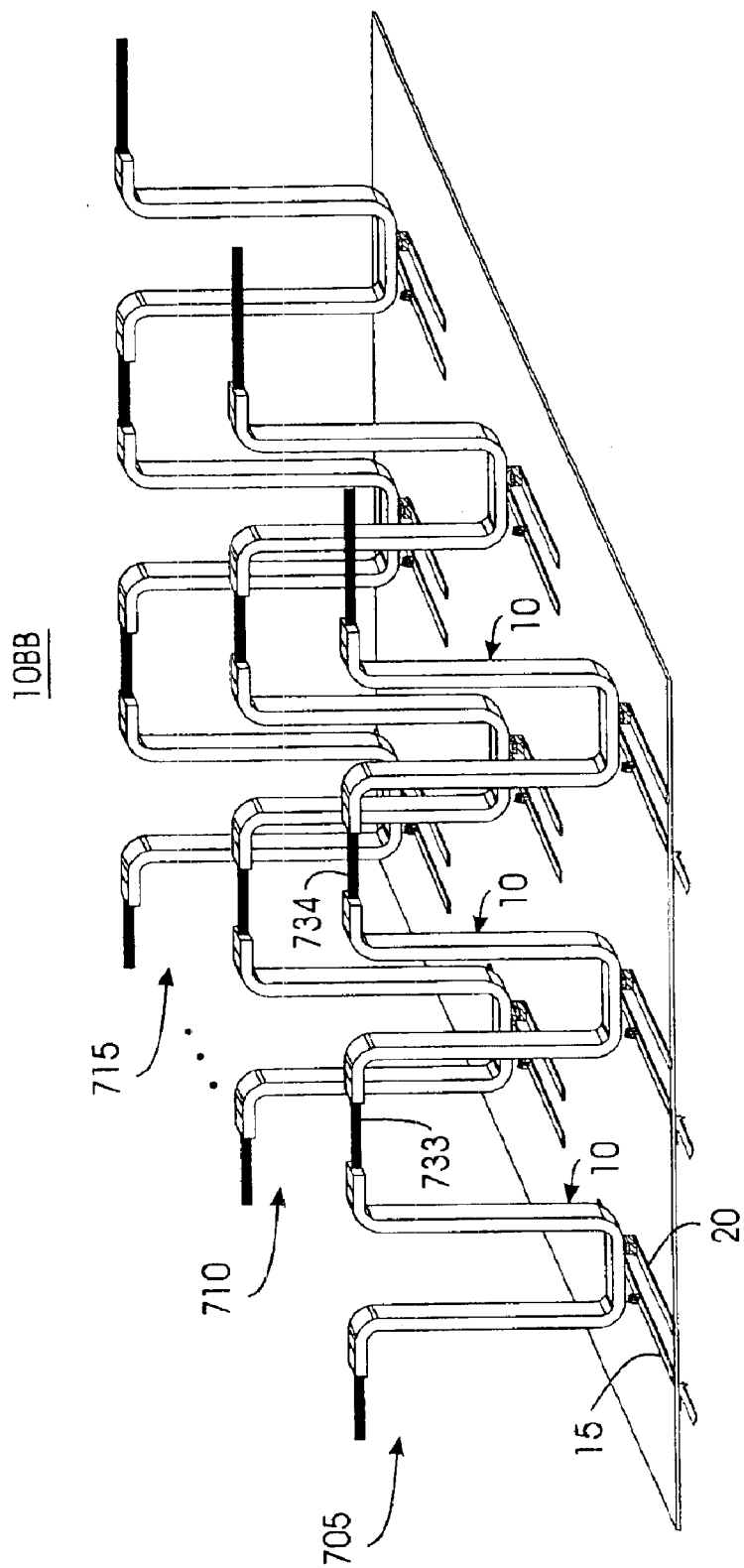
FIG. 7 is a schematic diagram illustrating an embodiment with an array of magnetic shift registers of FIG. 1.

FIG. 7 illustrates a shift register 10BB according to yet another embodiment of the present invention. The shift register 10BB is comprised of a plurality of magnetic shift registers 10 (or a combination of other suitable shift registers described herein) that are connected in an array configuration. The array configuration is shown for example purpose only, as comprising three rows 705, 710, 715 of magnetic shift registers 10, with each row comprised of numerous shift registers 10. The shift registers 10 in each row are connected in series, while the various rows 705, 710, 715 are connected in parallel. The sections, i.e., 733, 734, that connect the magnetic shift registers 10 in one row, i.e., row 705, may be a high conductivity material such as copper, or a ferromagnetic material, such as that used in the magnetic shift array 10BB.

Figure 8E:
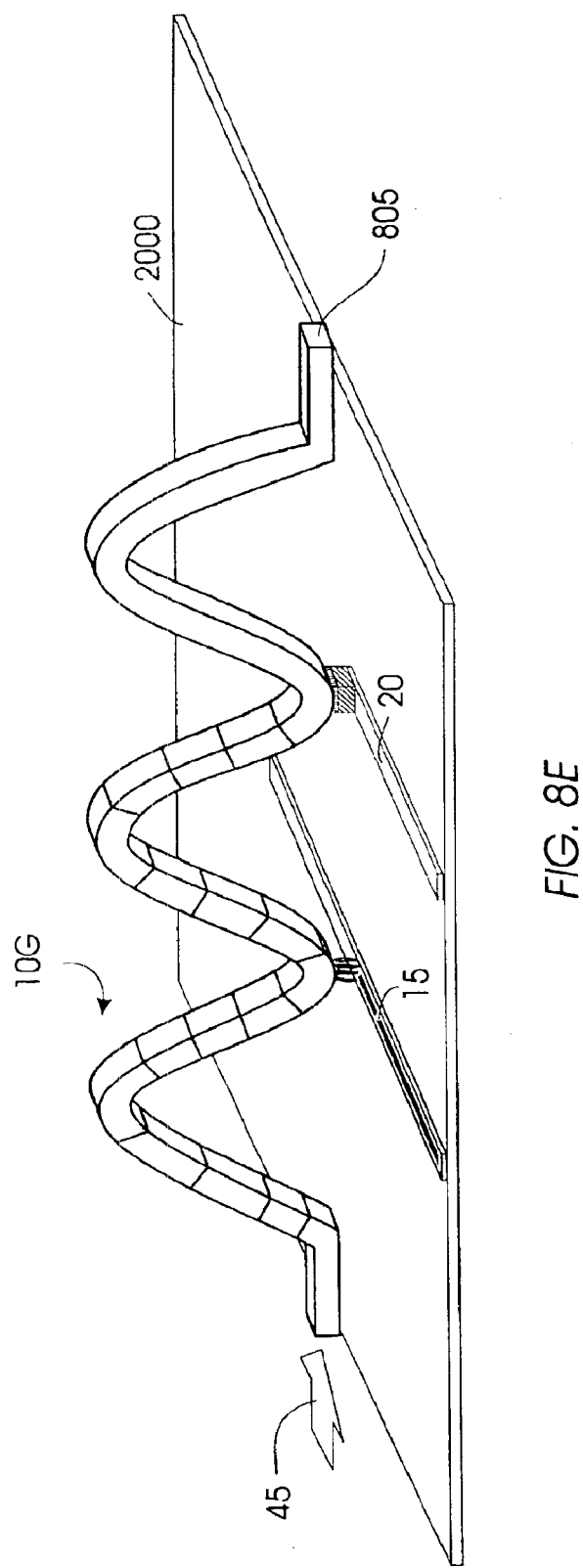
FIG. 8 is comprised of FIGS. 8A, 8B, 8C, 8D, and 8E, and represents schematic diagrams illustrating various embodiments of configurations of the magnetic shift register of FIG. 1.

Although the magnetic shift registers, i.e., 10, described so far are shown to have a generally "U" shape, the shape of the magnetic shift registers is not limited to that shape. FIG. 8 (FIGS. 8A, 8B, 8C, 8D, 8E) illustrates various exemplary, non-limiting embodiments of the magnetic shift register 10.

With reference to FIG. 8A, a magnetic shift register 10C may be formed in a generally "W" shape. With reference to FIG. 8B, a magnetic shift register 10D may be formed in a generally semi-circular shape. With reference to FIG. 8C, a magnetic shift register 10E may be formed in a generally "V" shape. With reference to FIG. 8D, a magnetic shift register 10F may be formed in a generally "N" shape. With reference to FIG. 8E, a magnetic shift register 10G may be formed in a generally serpentine shape with the input current 45 and output connection 805 on the same plane as the writing device 15 and the reading device 20.

The magnetic shift register 10 may be formed in any shape that accomplishes the objective of shifting the magnetic domains as described herein. In addition, the placement of the writing device 15 and the reading device 20 is not limited to any particular position. As illustrative examples, the writing device 15 may be disposed either on the left side or the right side of the reading device 20. In FIG. 1, the writing device 15 is shown on the left of the reading device 20. In FIG. 8A, the writing device 15 is shown on the right of the reading device 20.

Although the figures show the reservoir 40 as being a continuous section of track 11, and the data region(s) 35 as being a continuous set of domains, it should be clear that the data region(s) 35 could be a set of smaller data regions separated by smaller lengths of reservoir(s) 40.

FIG. 9 (FIGS. 9A, 9B, 9C, 9D) illustrates alternative embodiments for the placement of the writing devices 15 and the reading devices 20. Using, for example, a U-shape configuration for the magnetic shift register 10, the reading device 20 and writing device 15 may be placed on a lateral side 909 of the magnetic shift register 10 (FIG. 9A).

In the embodiment of FIG. 9B, the reading device 20 is disposed on the interior of lateral side 909, while the writing device 15 is disposed on the interior of lateral side 911. In addition, the reading device 20 and the writing device 15 may be placed at opposite ends of the magnetic shift register 10, or in alignment with each other. In another embodiment, one of the writing device 15 or the reading device 20 can be disposed on the exterior while the other device can be disposed on the interior of the magnetic shift register 10. In yet another embodiment, the reading device 20 and the writing device 15 are not disposed in alignment with each other.

The disposition of the writing and reading elements are chosen for ease of operation and manufacturability of the magnetic shift register. Moreover, the disposition of these elements, especially if the reading and writing elements are significantly displaced from one another, will affect the proportion of the magnetic shift register which can be occupied by the storage region. Separating the reading and writing elements significantly from one another along the shift register will reduce the size of the storage region in proportion of the total length of the shift register.

Multiple reading devices 20 and writing devices 15 may be used as shown in FIG. 9C. Although FIG. 9C shows equal numbers of reading devices 20 and writing devices 15, unequal numbers of each device may alternatively be used. These multiple reading devices 20 and writing devices 15 may be placed on opposite sides 909, 911 of the magnetic shift register 10, as shown in FIG. 9C.

Alternatively, the multiple reading devices 20 and writing devices 15 may be disposed, in an alternating relationship, on the same side, i.e., 909, of the magnetic shift register 10, as shown in FIG. 9D. It is preferred that the writing and reading elements are located in close proximity to one another to maximize the extent of the storage region in proportion to the overall length of the magnetic shift register.

As previously presented, a current 45 passed through a track 11 having a series of domains with alternating directions can move these domains past the writing device 15 or reading device 20. Associated with each domain wall is a large magnetic fringing field. The domain wall concentrates the change in magnetism from one direction to another in a very small space. Depending on the nature of the domain wall, a sufficiently large dipolar fringing field can emanate from the domain wall.

Figure 10A:
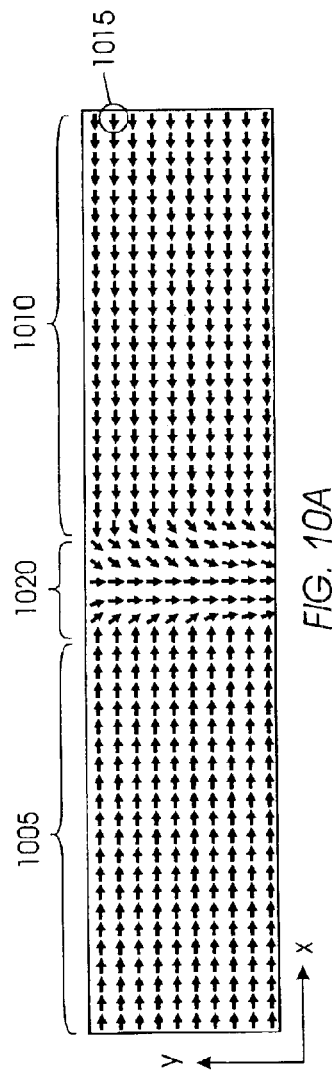
FIG. 10 is comprised of FIGS. 10A, 10B, and 10C, and represents a schematic diagram and two graphs illustrating fringing fields of the magnetic memory system of FIG. 1.
Figure 10B:
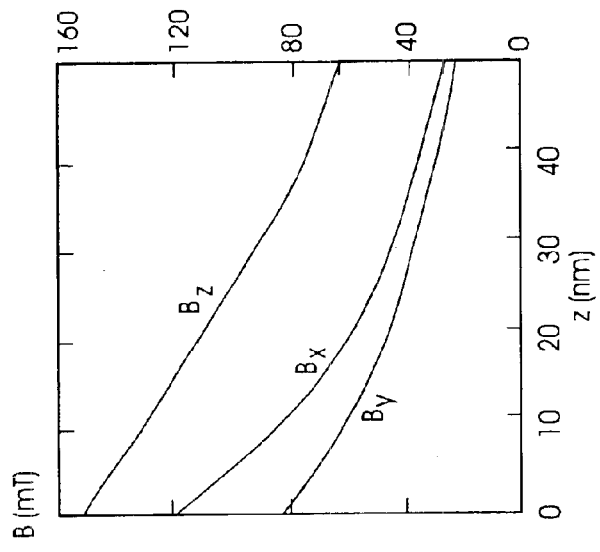
Figure 10C:
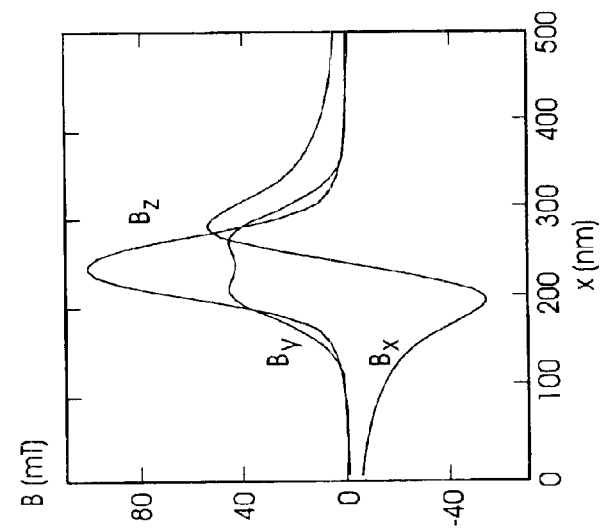

FIG. 10 (FIGS. 10A, 10B, 10C) illustrates the concept of domains, domain walls, and fringing fields, as used in conjunction with the present invention. FIG. 10A shows an exemplary magnetic material with two domains 1005 and 1010.

The arrows, such as arrow 1015, represent a magnetic moment, or dipole, and indicate local magnetization directions. The magnetic moments in domain 1005 point to the right, while the magnetic moments in domain 1010 point to the left. The domain wall 1020 is the region in which domains 1010, 1005 of opposite polarity meet. The change of magnetism between domain 1005 and domain 1010 is concentrated in the small domain wall 1020, creating a large dipolar fringing field emanating from the surface of the layer.

The relative magnitude of an exemplary fringing field B is shown in FIG. 10B. The fringing field B is localized and concentrated over a region of, for example approximately 100 nm, in the x dimension. The peak values of the components Bx, By, and Bz of the fringing field B, are illustrated in FIG. 10C as a function of out-of-plane distance. The fringing field is also localized in the z direction, and is concentrated primarily in a region of approximately 20 nm in the z direction.

These fringing field components Bx, By, and Bz are very high in the region of the domain wall 1020, and drop off rapidly with distance from the domain wall 1020. Consequently, the fringing field B is localized and sufficiently large for use to magnetize a ferromagnetic material in a small region.

The fringing field B is used to write onto the magnetic shift register 10. When the domain wall 1020 is moved close to another magnetic material, the large fringing field B of the domain wall 1020 changes the direction of the magnetic moment in the magnetic material, effectively "writing" to the magnetic material. This domain wall 1020 can be moved within the magnetic material by passing a current 45 through the magnetic material that is perpendicular to the domain wall 1020.

With reference to FIG. 11 (FIGS. 11A and 11B), the writing device 15 is comprised of a ferromagnetic track or wire 1105 that is placed in proximity to the magnetic shift register 10. As illustrated for exemplary purposes, the ferromagnetic track 1105 is comprised of a plurality of successive domains 1110, 1115, and 1120. These domains 1110, 1115, 1120 define domain walls 1125, 1130, there between.

Associated with a first domain wall 1125 is fringing field 1135; and with a second domain wall 1130 is fringing field 1140. When one of the domain walls 1125 or 1130 of the writing device 15 passes the region closest to the magnetic shift register 10, the large magnetic field in the domain wall 1125 or 1130 of the writing device 15 can be used to write on the magnetic shift register 10.

In order to write to the magnetic shift register 10, the writing device 15 selectively changes the direction of the magnetic moment of a domain 1145 in the magnetic shift register 10. In the present illustration, the magnitude of the fringing field 1135 applied to the magnetic shift register 10 decreases rapidly outside the region around the domain wall 1125, either in the writing device 15 or the magnetic shift register 10. The magnitude of the fringing field applied by the writing device 15 to the magnetic shift register 10 can be controlled by controlling the relative location of the domain wall 1125 in the writing device 15. The location of the domain wall 1125 is controlled by applying a current 1150 (also referred to herein a current 45) to the writing device 15.

Figure 12:
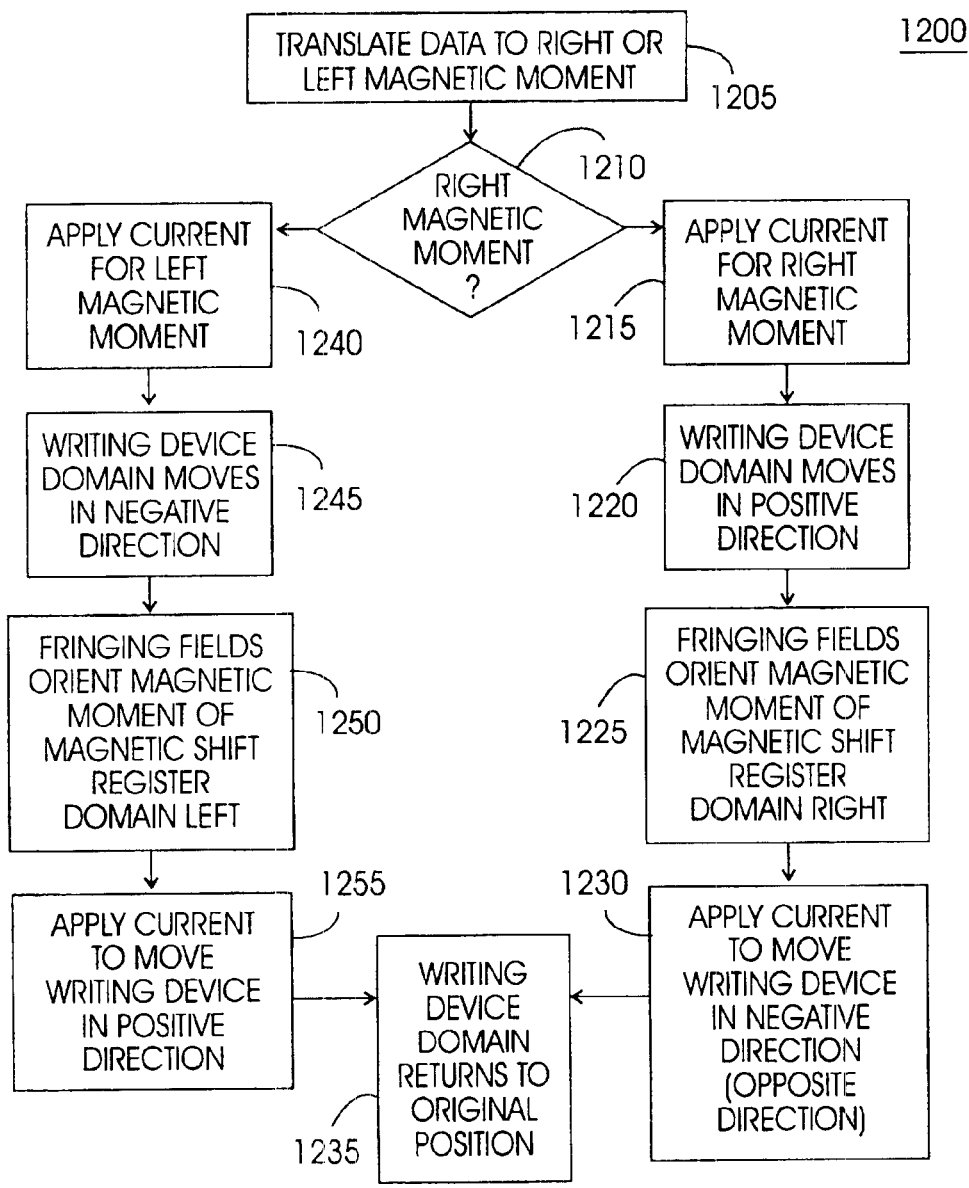
FIG. 12 is a process flow chart illustrating a method of operation of the writing device of FIG. 1.
Figure 13C:
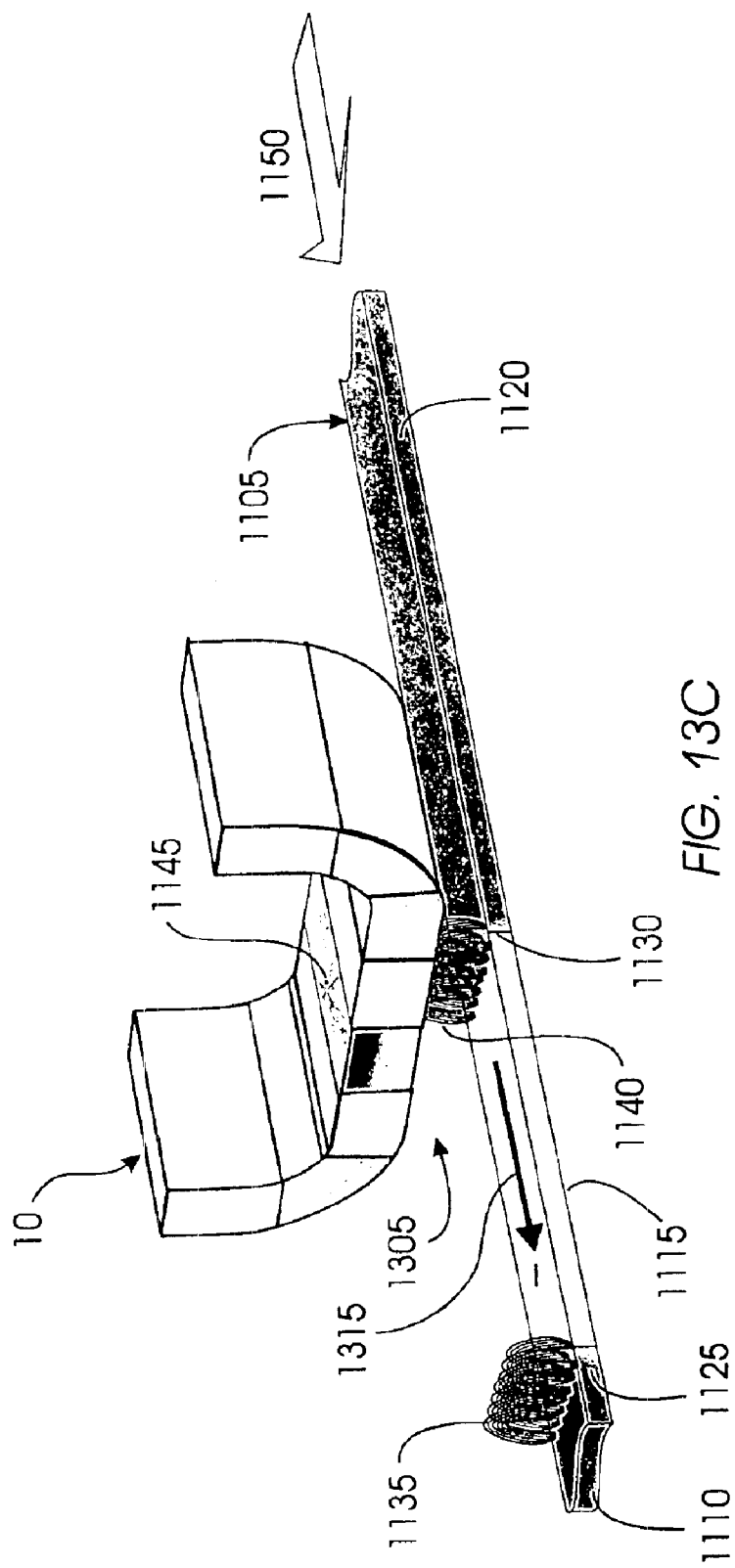
FIG. 13 is comprised of FIGS. 13A, 13B, and 13C, and represents a schematic diagram portraying a method of operation of the operation of the writing device of FIG. 1.

A method 1200 of the writing device for writing data according to the present invention, is illustration by the process flow chart of FIG. 12, considered in conjunction with FIG. 13 (FIGS. 13A, 13B, 13C). The domain wall and its associated magnetic fringe fields are shown in a quiescent position outside a write region 1305 (FIG. 13B) of the writing device in FIG. 13. A request to write data is received by the memory system.

At block 1205 of FIG. 12, the memory system translates the data (0 or 1) into whether the domain 1145 receives a magnetic moment pointing right (a right magnetic moment) or a magnetic moment pointing left (a left magnetic moment). The magnetic moment direction of the domains can be either along the track direction or perpendicular to the track direction. For very narrow tracks the preferred direction of the magnetic moments will be along the track direction. If, at decision block 1210, the domain 1145 is to be written with a right magnetic moment, method 1200 proceeds to block 1215.

At block 1215, a current 1150 is applied to the writing device 15 in FIG. 13A, moving the domain wall 1125 in the positive direction (block 1220), as denoted by direction 1310. Consequently, fringing field 1135 is moved within the write region 1305 (FIG. 13B). The magnetic fringe field 1135 writes to the magnetic shift register 10 (block 1225), changing the direction of the magnetization of domain 1145 to point in the right direction.

The current 1150 is then applied to the writing device (block 1230) in a direction 1315 (FIG. 13C) that is opposite to the previous direction 1310, so that the writing device domain 1110 is returned to its quiescent position shown in FIG. 13A (block 1235).

The writing device domain wall 1125 remains in close proximity of the magnetic shift register 10 for only an instant, or a predetermined period of time, that is sufficient to write to the domain 1145 of the magnetic shift register 10. The magnitude of fringing field 1135 that is applied to domain 1145 is large only when the domain wall 1125 of the writing device 15 is in proximity to the magnetic shift register 10.

If the domain 1145 is to be written with a left magnetic moment at decision block 1210, method 1200 proceeds to block 1240. At block 1240, a current 1150 is applied to the writing device 15, as illustrated in FIG. 13C, to cause the domain wall 1110 to move in the negative direction (block 1245), as denoted by the reference numeral 1315.

A fringing field 1140 is shifted within the write region 1305 (FIG. 13C). The magnetic fringe field writes to the magnetic shift register 10 (block 1250), changing the direction of the magnetization of domain 1145 to point in the left direction. A current 1150 is then applied to the writing device (block 1255), and the writing device domain 1110 is returned to its quiescent position shown in FIG. 13A (block 1235).

In an alternative embodiment shown in FIG. 14 (FIGS. 14A, 14B), the domain walls 1125,1130 (FIG. 13) can be brought even closer to the magnetic shift register 10 by means of an arch-shaped bend 1405 in a track 1410 of the writing device 15A. A current 1415 applied to the writing device 15A pushes the domain wall 1420 in very close proximity to the magnetic shift register 10, enhancing the effect of the fringing field from the domain wall 1420.

In another embodiment, shown in FIG. 15 (FIGS. 15A, 15B), the arch-shaped bend 1405 of FIG. 14 is replaced with a small ferromagnetic block 1505. A thin layer 1510 is formed on top of the ferromagnetic block 1505. The thin layer is used to determine the spacing of the ferromagnetic material 1505 from the track 10. Since the writing device should not be electrical contact with the shift register, the thin layer 1510 may be formed from an insulating material which may be contiguous with the insulating material that will surround the writing device 15B and the shift register 10. The domain wall 1515 is pushed to the middle of ferromagnetic block 1505 by the current 1520.

Figure 16:
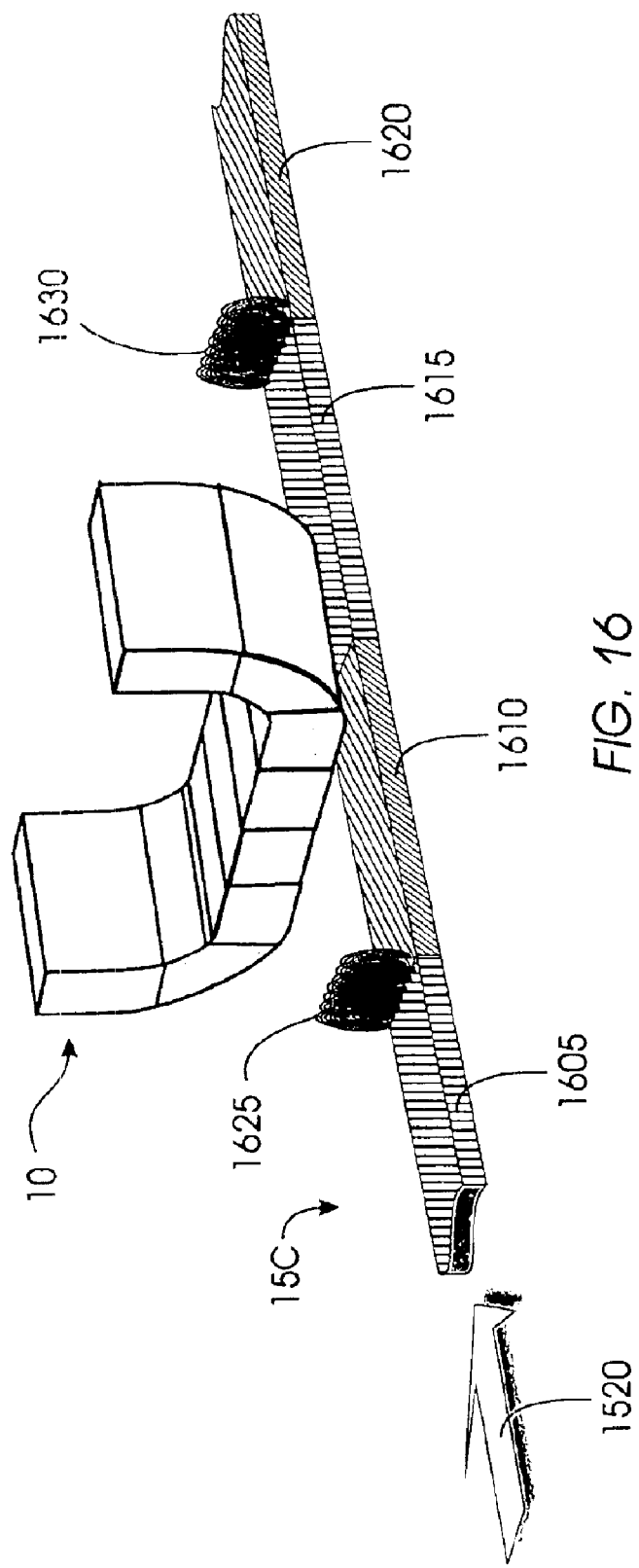
FIG. 16 represents a configuration of an alternative embodiment of the writing device of FIG. 1, using multiple types of ferromagnetic material.

In a further embodiment, the homogeneous ferromagnetic material in the writing device 15C, can be replaced by inhomogeneous material, as shown in FIG. 16. Track 1605 of the writing device 15C is constructed of alternating types of ferromagnetic materials. For example, blocks 1605 and 1615 are one type of magnetic material while block 1610 and 1620 are another type. Two or more types of ferromagnetic materials may be used in various positions in the track 1605. These alternating types of ferromagnetic materials serve to create defined regions in which the domains in the track 1605 reside, minimizing drift and allowing higher tolerance in current amplitude and pulse width, as presented earlier.

The magnetic moments of blocks 1610 and 1615 are aligned in the same direction so that no fringing fields are applied to the magnetic shift register 10 when the writing device 15C is in the quiescent state. Otherwise, fringing fields 1625 and 1630 write to the magnetic shift register 10 when the proper current is applied to move the domains in the writing device 15C.

In this embodiment, the domain walls are moved so that they are situated under the track for a time determined by sequential current pulses 1520. The first pulse moves the domain wall fringing fields 1625 or 1630 underneath the track 11. The time delay before a second current pulse will determine how long the domain wall fringing field is allowed to write the track 11.

In another embodiment, the magnetic regions or domains 1610 and 1615 can be combined and formed from one magnetic material, and the magnetic regions 1605 and 1620 are formed from an alternate magnetic material since there is no need to have a means of providing a pinning potential for the domain wall underneath the track 10 since the writing of the track 10 can be performed by simply passing the domain wall and its associated fringing field underneath the track 10 without stopping under the track.

Figure 17:
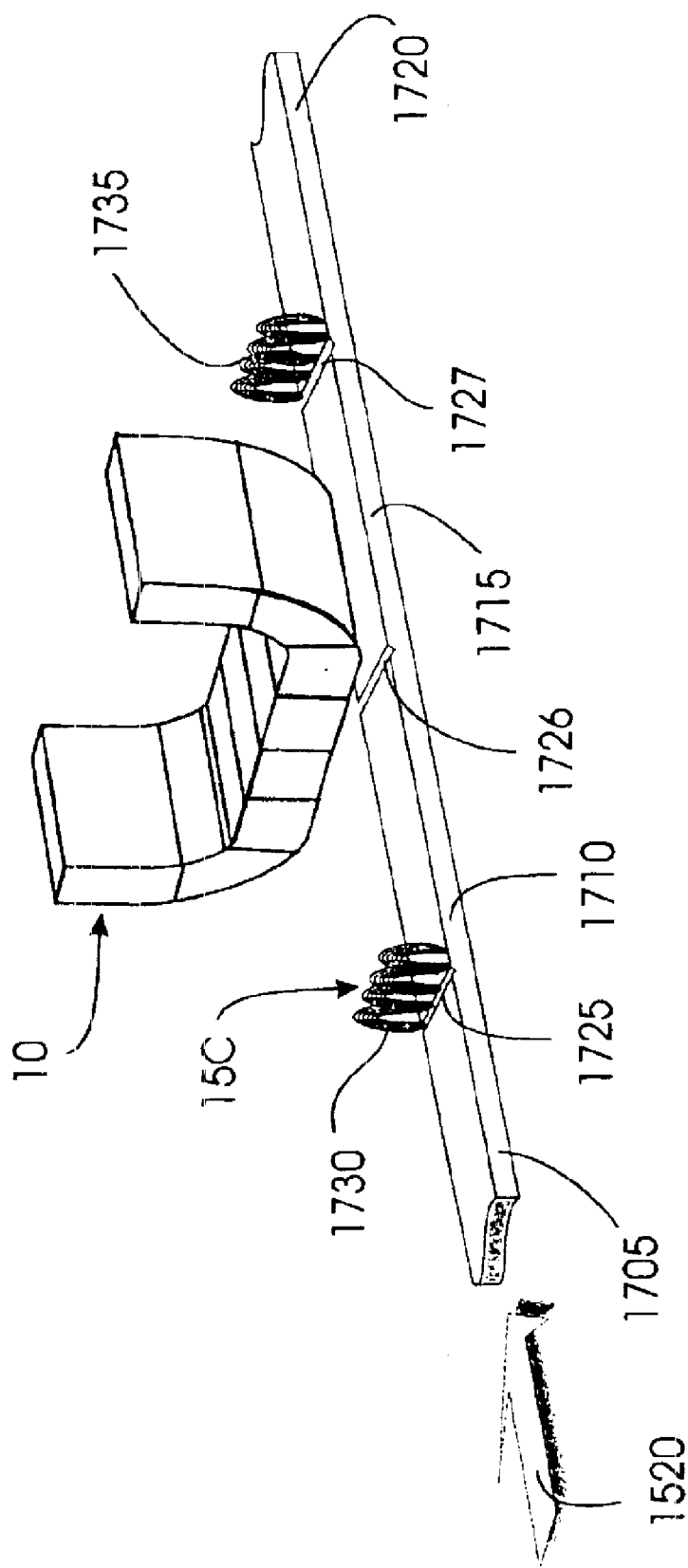
FIG. 17 represents a configuration of an alternate embodiment of the writing device of FIG., 1, using indentations in a track of ferromagnetic material.

The effect of inhomogeneous material may be created by introducing indentations 1725, 1726, 1727 in the track 1705 of the writing device 15D, as shown in FIG. 17. These indentations 1725, 1726, 1727 also serve to fix the regions in which the domains in the track 1705 reside. The indentations 1725, 1726, 1727 can be of any physical form that provides a pinning potential for the domain walls.

As shown in FIG. 17, the indentations 1725, 1726, 1727 are disposed on top of the writing element track. Alternatively, they can be on one side or both sides of the writing device's track. Similarly, the indentations can be replaced with arch-shaped regions in the wire, as indicated by the reference numeral 1405 in FIG. 14B. Alternatively, the indentations 1725, 1726, 1727 can be combined with an-arch shaped region in the vicinity of the magnetic shift register 10 for increasing the magnitude of the domain wall fringing field provided at the magnetic shift register.

The indentations 1725, 1726, 1727 are placed between domains 1705, 1710, 1715, and 1720. In the present illustration, indentation 1726 is placed below the magnetic shift register 10, to fix the placement of fringing fields 1730 and 1735 that are used to write to the magnetic shift register 10. When an appropriate current is applied to the writing device 15C, the fringing fields 1730 and 1735 move to indention 1726, allowing precision placement of the fringing field. In a further embodiment, the reading device may be made of a combination of different ferromagnetic materials with indentations, combining the features of magnetic shift register 15C and 15D.

In another embodiment, no indentation is made under the shift register 10. The writing of the shift register is achieved simply by moving the domain walls and their associated fringing fields under and across the shift register 10 without ever having the domain walls stationary underneath the shift register.

The local magnetic fields of the fringing fields can be very large and can approach the magnetization of the material, 4 $\pi$M. In disk drive writing heads, the maximum achievable field is 4 $\pi$M of the magnetic disk material. Disk drive development seeks to make the magnetization larger, making larger magnetic moments and larger fields to ensure adequate writing to the disk.

In the present writing device, the magnitude of the domain wall fringing fields is related to the magnitude of the material used in the writing device. Local fields of several thousand oersteds are achievable. Consequently, the writing device can write strongly and reliably to the magnetic shift register 10. The width of the writing device is the width of the domain written on the magnetic shift register 10. In one embodiment, the typical width of the writing device might be 100 nm in size.

A device similar to a magnetic tunneling junction can be used to read the information stored on the magnetic shift register 10. A magnetic tunneling junction (MTJ) has two layers of magnetic material separated by a thin layer of insulating material which comprises a tunneling barrier. This tunneling barrier is typically formed from an ultra thin layer of aluminum oxide although it can also be formed from other insulating or semiconducting materials.

One magnetic layer in the MTJ is typically a hard magnetic material that requires a large magnetic field to change its magnetization. The other magnetic material is typically a soft magnetic material, allowing a weak magnetic field to change its magnetization. When a small magnetic field is applied to the soft magnetic material, its direction of magnetization changes so that the direction of the magnetization of the soft magnetic layer can be varied relative to that of the hard magnetic material. The magnitude of the current passed through the tunneling barrier depends on the relative magnetic orientation of the two magnetic materials in the tunneling junction. Consequently, the value of the current in the tunneling junction indicates the direction of the magnetic moment in the soft magnetic material if the moment of the hard layer is known or the current in the tunneling junction indicates the direction of the moment of the hard magnetic material if the direction of the moment of the soft magnetic material is known. The two magnetic materials in the magnetic tunneling junction can also be formed from hard magnetic materials if means for independently switching the magnetic moments in the MTJ are provided. The tunneling current passing through the MTJ allows the direction of the magnetic moment of either one of the two magnetic materials in the MTJ, i.e., the storage layer, to be determined if the direction of the magnetic moment of the other material, i.e., the reference layer, is known.

Figure 18B:
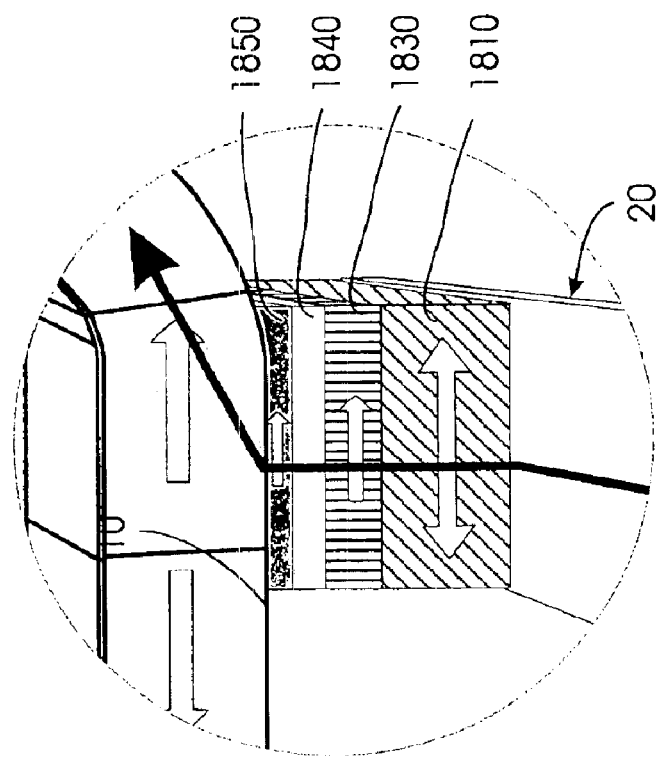
FIG. 18 is comprised of FIGS. 18A and 18B, and represents a configuration of the reading device of FIG. 1.
Figure 18A:
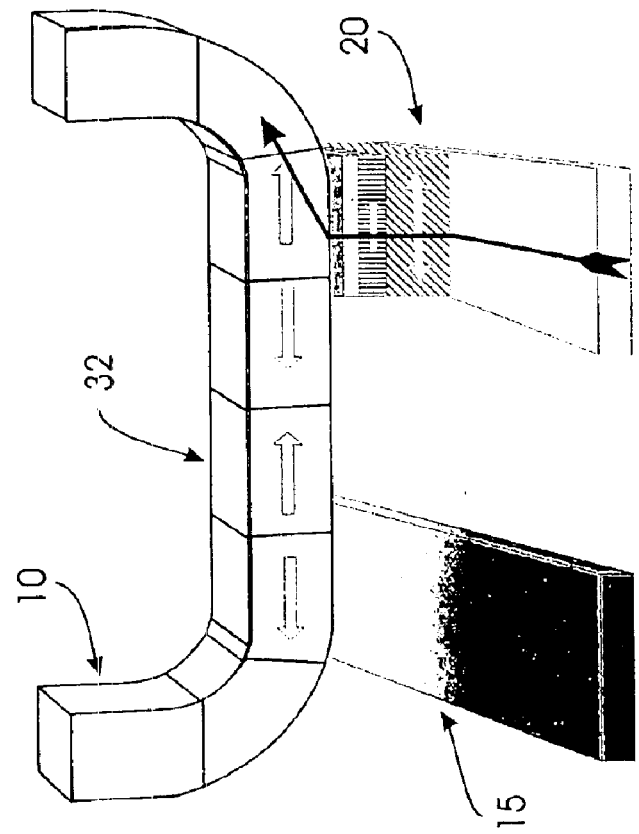

By incorporating the magnetic shift register 10 as part of the magnetic tunneling junction, information stored in the domains in the magnetic shift register 10 can be read in terms of the magnitude of the current that passes through the magnetic tunnel junction. The reading device 20 shown in FIG. 18 (FIGS. 18A, 18B) has a reference magnetic layer 1830 which is formed from a hard magnetic material whose magnetization direction is set in a given direction during the process of fabricating the magnetic shift register. The magnetic shift register 10 forms the storage magnetic layer of the magnetic tunneling junction reading device.

The tunneling barrier 1840 of the MTJ resides between the reference magnetic layer 1830 and the magnetic shift register 10. As the domains flow pass the reading device 20, the magnitude of the current indicates the value stored by the direction of the domain in the shift register 10. Moving the domains around the magnetic shift register 10 brings the chosen domain to the reading device 20 for reading purposes.

The reference layer can be formed from a magnetic material which is sufficiently hard that its moment direction is not affected by the fringing fields from the domain walls in the magnetic shift register as the domains are moved around the magnetic shift register. For example, the reference layer could be formed from alloys of Co and Pt or alloys of rare-earth metals and transition metals such as alloys formed from Co, Fe and Tb. Alternatively, the reference layer can be formed from a magnetic material which is soft such as a binary or ternary alloy formed from two or more of Ni, Fe and Co. The magnetic moment of the reference layer is fixed in a particular direction by using the well known phenomenon of exchange bias and coupling the reference layer to a layer of an antiferromagnetic material 1810. The antiferromagnetic material can be formed from various alloys including alloys of Mn with Fe, Ni, Ir, Pt, Pr, Cr etc.

In an alternative embodiment, for ease of fabrication of the magnetic tunnel junction, an additional thin layer of a soft ferromagnetic material 1850 is inserted between the magnetic shift register 10 and the tunneling barrier layer 1840. Since the characteristics of the MTJ are extremely sensitive to the nature of the interface between the tunneling barrier and the magnetic layers in the MTJ it may be preferred to form the MTJ with the tunneling barrier covered with a ferromagnetic layer 1850.

Furthermore, for the purposes of obtaining the largest signal from the MTJ it may be preferred to form the layer 1850 from a magnetic material which is designed to optimize the reading signal from the MTJ. It should be clear that the layer 1850 is adjacent and exchange coupled to the shift register so that its magnetic moment will always be largely in the same direction as the magnetic moment of the adjacent material in the shift register.

Figure 19:
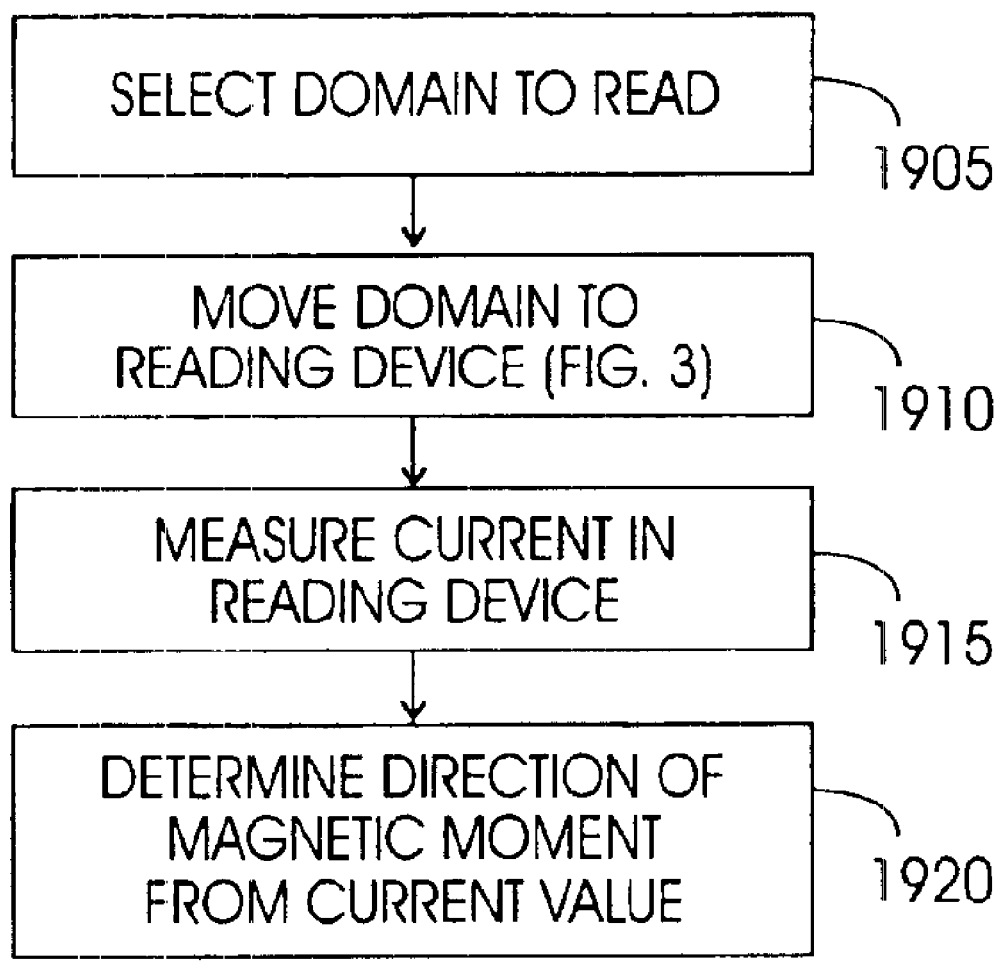
FIG. 19 is a process flow chart illustrating a method of operation of the reading device of FIG. 1.

A method 1900 used by the writing device 20 to read data stored on the shift register 10 is described by the process flow chart of FIG. 19. A magnetic memory system selects a bit to read (block 1905). At block 1910, the magnetic shift register 10 moves the corresponding domain to the reading device as described in connection with FIG. 3.

If the magnetic moment in the domain of interest points right, for example, the magnitude of the current induced in the reading device 20 may be large, otherwise, the magnitude induced in the reading device 20 is small. The reading device may be configured that the opposite case is true. Either way, the magnitude of the current can be used to determine the direction of the magnetic moment in the selected domain.

At block 1915, the magnetic memory system measures the current induced in the reading device, and determines the direction of the magnetic moment from the current value at block 1920. The magnetic moment direction represents the data stored in that domain of the magnetic shift register 10. It should be clear that the directions used for magnetic moment and current used to describe the present illustration are of exemplary nature only.

In the preceding figures, such as FIG. 1, the shift registers are shown as being above the reference plane of circuitry including the reading and writing elements. The shift registers can equally well be disposed beneath the plane of circuitry. Furthermore, as illustrated in FIG. 20, the shift registers can de disposed both above and below the reference plane of circuitry to further increase the overall storage capacity of the memory.

Figure 20A:
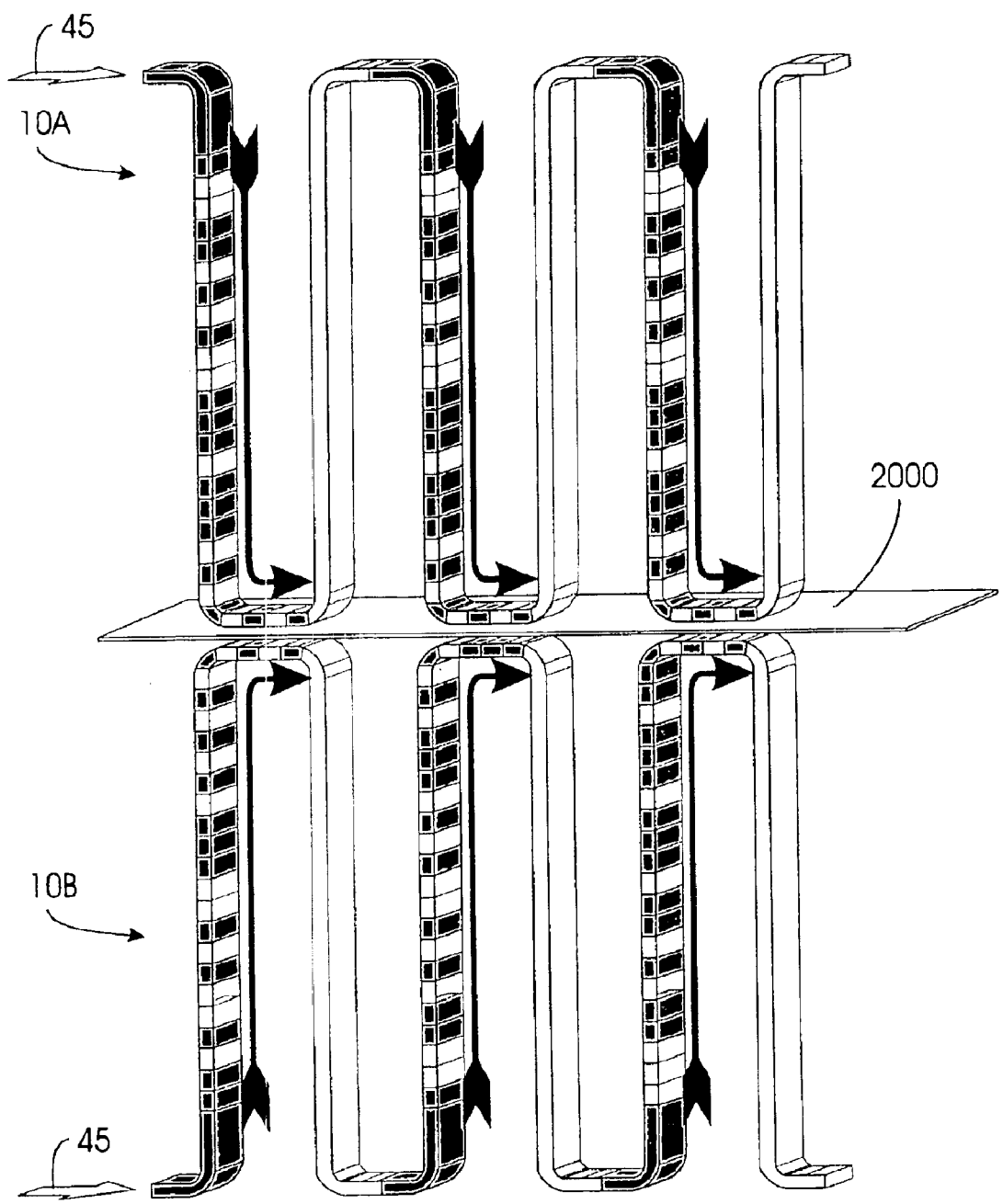
FIG. 20 is comprised of FIGS. 20A and 20B, and illustrates two embodiments of the shift registers disposed above and below the reference plane of the control circuits.
Figure 20B:
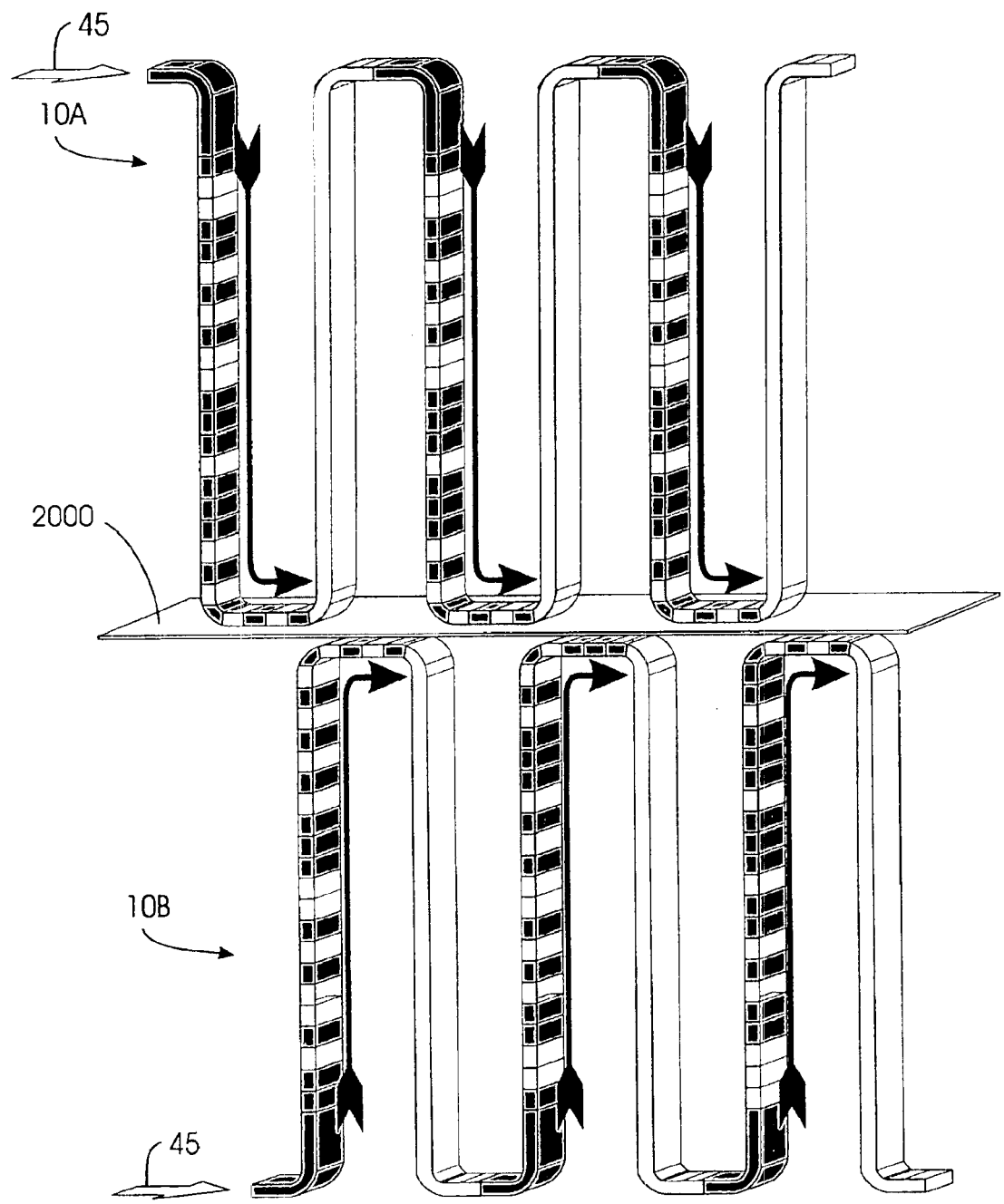

In FIG. 20A, the shift registers 10A and 10B are disposed in alignment with each other. In FIG. 20B the shift registers 10A and 10B are displaced from one another. While the current is shown to enter and exit the shift registers 10A and 10B remotely from the reference plane 2000 the current can equally well enter and/or exit close to the reference plane as illustrated in FIG. 8D.

It is to be understood that the specific embodiments of the invention that have been described are merely illustrative of certain application of the principle of the present invention. Numerous modifications may be made to the system and method for writing to a magnetic shift register invention described herein without departing from the spirit and scope of the present invention.

What is claimed is:

1. A data writing element, comprising:
   a wire that comprises magnetic domains that define at least one magnetic domain wall; and
   an energy source for passing an electric current through the wire, to selectively shift the magnetic domain wall along the wire;
   wherein shifting the magnetic wall generates a localized fringing field that causes data to be written on a medium that is disposed in proximity to the wire.

2. The data writing element of claim 1, wherein the electric current is moved in one direction to write data in a "1" bit.

3. The data writing element of claim 2, wherein the electric current is moved in an opposite direction to write data in a "0" bit.

4. The data writing element of claim 1, wherein the wire comprises a bend that is disposed in proximity to the medium, to enhance the effect of the fringing field from the domain wall.

5. The data writing element of claim 1, wherein the medium comprises a shift register.

6. The data writing element of claim 5, wherein the shift register comprises a plurality of magnetic domains for storing the data.

7. The data writing element of claim 6, wherein the shifting of the magnetic wall causes the data to be written in the magnetic domains.

8. The data writing element of claim 1, wherein the medium comprises a data storage disk.

9. The data writing element of claim 1, wherein the wire comprises a plurality of domains.

10. The data writing element of claim 9, further comprising means for pinning at least some of the domains.

11. The data writing element of claim 1, wherein the wire is made, at least in part, of magnetic material having a direction of magnetization; and
    wherein the electric current comprises electrons having a spin polarization in the same direction as the direction of magnetization.

12. The data writing element of claim 1, wherein the wire is made, at least in part, of magnetic material having a direction of magnetization; and
    wherein the electric current comprises electrons having a spin polarization in a direction that is opposite to the direction of magnetization.

13. A data writing element, comprising:
    means, comprising magnetic domains, for defining at least one magnetic domain wall; and
    means for passing an electric current through the defining means, to selectively shift the magnetic domain wall along the defining means;
    wherein shifting the magnetic wall generates a localized fringing field that causes data to be written on a medium that is disposed in proximity to the defining means.

14. The data writing element of claim 13, wherein the electric current is moved in one direction to write data in a "1" bit.

15. The data writing element of claim 14, wherein the electric current is moved in an opposite direction to write data in a "0" bit.

16. The data writing element of claim 13, wherein the defining means comprises a raised section with respect to an adjacent portion, that is disposed in proximity to the medium, to enhance the effect of the fringing field from the domain wall.

17. The data writing element of claim 13, wherein the medium comprises a shift register.

18. The data writing element of claim 17, wherein the shift register comprises a plurality of magnetic domains for storing the data.

19. The data writing element of claim 18, wherein the shifting of the magnetic wall causes the data to be written in the magnetic domains.

20. The data writing element of claim 13, wherein the medium comprises a data storage disk.

21. The data writing element of claim 13, wherein the defining means comprises a plurality of domains.

22. The data writing element of claim 21, further comprising means for pinning at least some of the domains.

23. The data writing element of claim 13, wherein the means for defining at least one magnetic domain wall is made, at least in part, of magnetic material having a direction of magnetization; and
    wherein the electric current comprises electrons having a spin polarization in the same direction as the direction of magnetization.

24. The data writing element of claim 13, wherein the means for defining at least one magnetic domain wall is made, at least in part, of magnetic material having a direction of magnetization; and
    wherein the electric current comprises electrons having a spin polarization in a direction that is opposite to the direction of magnetization.

25. A method for writing data on a medium that is disposed in proximity to the wire, comprising:

using a wire that comprises magnetic domains, for defining at least one magnetic domain wall; and passing an electric current through the wire, to selectively shift the magnetic domain wall along the wire;

wherein shifting the magnetic wall generates a localized fringing field that causes data to be written on the medium.

26. The method of claim 25, wherein passing the electric current comprises moving the electric current in one direction to write data in a "1" bit.

27. The method of claim 26, wherein passing the electric current comprises moving the electric current in an opposite direction to write data in a "0" bit.

28. The method of claim 25, wherein the wire comprises a raised section with respect to an adjacent portion that is disposed in proximity to the medium, to enhance the effect of the fringing field from the domain wall.

29. The method of claim 25, wherein the medium comprises a shift register.

30. The method of claim 29, wherein the shift register comprises a plurality of magnetic domains for storing the data.

31. The method of claim 30, wherein the shifting of the magnetic wall causes the data to be written in the magnetic domains.

32. The method of claim 25, wherein the medium comprises a data storage disk.

33. The method of claim 25, wherein the wire comprises a plurality of domains.

34. The method of claim 33, further comprising means for pinning at east some of the domains.

35. A data writing element for writing data on a medium that is disposed in proximity to the data writing element, comprising:

a wire that comprises a plurality of magnetic domains that define a plurality of magnetic domain walls along the wire;

an input for passing an electric current through the wire, to selectively shift the magnetic domain walls along the wire; and wherein shifting the magnetic walls generates a localized fringing field that causes data to be selectively written on the medium by the localized fringing field.

* * * * *